(12) United States Patent
Kurosawa et al.

(10) Patent No.: US 9,762,024 B2
(45) Date of Patent: Sep. 12, 2017

(54) LASER APPARATUS AND EXTREME ULTRAVIOLET LIGHT GENERATION SYSTEM

(71) Applicant: GIGAPHOTON INC., Tochigi (JP)

(72) Inventors: Yoshiaki Kurosawa, Oyama (JP); Yasufumi Kawasuji, Oyama (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 15/016,961

(22) Filed: Feb. 5, 2016

(65) Prior Publication Data

US 2016/0156150 A1    Jun. 2, 2016

Related U.S. Application Data

(63) Continuation of application No. PCT/JP2013/076286, filed on Sep. 27, 2013.

(51) Int. Cl.
*H01S 3/23* (2006.01)
*H01S 3/223* (2006.01)
*H01S 3/107* (2006.01)
*H05G 2/00* (2006.01)
*G03F 7/20* (2006.01)
*H01S 3/10* (2006.01)
(Continued)

(52) U.S. Cl.
CPC ........ *H01S 3/2316* (2013.01); *G03F 7/70041* (2013.01); *H01S 3/107* (2013.01); *H01S 3/2232* (2013.01); *H05G 2/003* (2013.01); *H05G 2/005* (2013.01); *H05G 2/008* (2013.01); *H01S 3/005* (2013.01); *H01S 3/034* (2013.01); *H01S 3/10061* (2013.01); *H01S 2301/02* (2013.01)

(58) Field of Classification Search
CPC ...... H01S 3/2316; H01S 3/2232; H01S 3/107; H01S 2301/02; H05G 2/008; H05G 2/003
USPC ....... 250/493.1, 494.1, 504 R; 359/350, 351, 359/353, 355, 361
See application file for complete search history.

(56) References Cited

U.S. PATENT DOCUMENTS 5,161,238 A    11/1992  Mehmke
7,068,367 B2    6/2006  Stobrawa et al.
7,589,337 B2    9/2009  Bykanov et al.
(Continued)

FOREIGN PATENT DOCUMENTS

JP    S61-224475 A    10/1986
JP    H2-032580 A    2/1990
(Continued)

OTHER PUBLICATIONS

International Search Report of PCT/JP2013/076286 mailed Mar. 18, 2014.
Written Opinion of PCT/JP2013/076286 mailed Mar. 18, 2014.

*Primary Examiner* — Nicole Ippolito
(74) *Attorney, Agent, or Firm* — Studebaker & Brackett PC

(57) ABSTRACT

An example of the disclosure is a laser apparatus including a master oscillator capable of outputting a pulse laser beam, a plurality of optical amplifiers disposed on an optical path of the pulse laser beam outputted from the master oscillator and configured to sequentially amplify the pulse laser beam, an optical reflector capable of passing the pulse laser beam therethrough and reflecting a self-oscillation beam generated in one of the plurality of optical amplifiers, and an optical absorber capable of receiving and absorbing the self-oscillation beam reflected by the optical reflector.

19 Claims, 16 Drawing Sheets

(51) Int. Cl.
*H01S 3/00* (2006.01)
*H01S 3/034* (2006.01)

(56) References Cited

U.S. PATENT DOCUMENTS

| | | |
|---|---|---|
| 7,928,416 B2 | 4/2011 | Fomenkov |
| 2008/0069157 A1 | 3/2008 | Ariga et al. |
| 2009/0232171 A1 | 9/2009 | Abe et al. |
| 2010/0117009 A1* | 5/2010 | Moriya ................ H01S 3/1305 250/504 R |
| 2010/0193710 A1 | 8/2010 | Wakabayashi et al. |
| 2010/0327192 A1 | 12/2010 | Fomenkov et al. |
| 2011/0261844 A1 | 10/2011 | Abe et al. |
| 2012/0080584 A1 | 4/2012 | Partlo et al. |

FOREIGN PATENT DOCUMENTS

| | | |
|---|---|---|
| JP | H3-261191 A | 11/1991 |
| JP | H6-152017 A | 5/1994 |
| JP | H6-164029 A | 6/1994 |
| JP | 2000-091670 A | 3/2000 |
| JP | 2009-246345 A | 10/2009 |
| JP | 2010-171375 A | 8/2010 |

* cited by examiner

LASER APPARATUS AND EXTREME ULTRAVIOLET LIGHT GENERATION SYSTEM

CROSS-REFERENCE TO RELATED APPLICATIONS

The present application is a continuation application of International Application No. PCT/JP2013/076286 filed on Sep. 27, 2013. The content of the application is incorporated herein by reference in its entirety.

BACKGROUND

1. Technical Field

The present disclosure relates to a laser apparatus and an extreme ultraviolet light generation system.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 70 nm to 45 nm, and further, microfabrication with feature sizes of 32 nm or less will be required. In order to meet the demand for microfabrication with feature sizes of 32 nm or less, for example, an exposure apparatus is needed in which a system for generating extreme ultraviolet (EUV) light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

CITATION LIST

Patent Literature

PTL1: U.S. Pat. No. 7,068,367
PTL2: U.S. Pat. No. 7,589,337
PTL3: U.S. Patent Application Publication No. 2012/0080584

SUMMARY

An example laser apparatus of the present disclosure may include a master oscillator capable of outputting a pulse laser beam, a plurality of optical amplifiers disposed on an optical path of the pulse laser beam outputted from the master oscillator, the plurality of optical amplifiers being configured to sequentially amplify the pulse laser beam, an optical reflector capable of passing the pulse laser beam therethrough and reflecting a self-oscillation beam generated in one of the plurality of optical amplifiers, and an optical absorber capable of receiving and absorbing the self-oscillation beam reflected by the optical reflector.

An example extreme ultraviolet light generation system of the present disclosure may include a master oscillator capable of outputting a pulse laser beam, an optical amplifier disposed on an optical path of the pulse laser beam outputted from the master oscillator and capable of amplifying the pulse laser beam, a droplet supply device capable of supplying a droplet which turns into plasma by being irradiated with the pulse laser beam amplified by the optical amplifier to generate extreme ultraviolet light, and a transmissive optical element disposed between the master oscillator and the optical amplifier and capable of transmitting the pulse laser beam. The transmissive optical element may be positioned such that reflection of spontaneous emission from the optical amplifier reflected off the droplet is directed to avoid the droplet.

BRIEF DESCRIPTION OF THE DRAWINGS

Hereinafter, selected embodiments of the present disclosure will be described with reference to the accompanying drawings.

EMBODIMENTS

Figure 1:
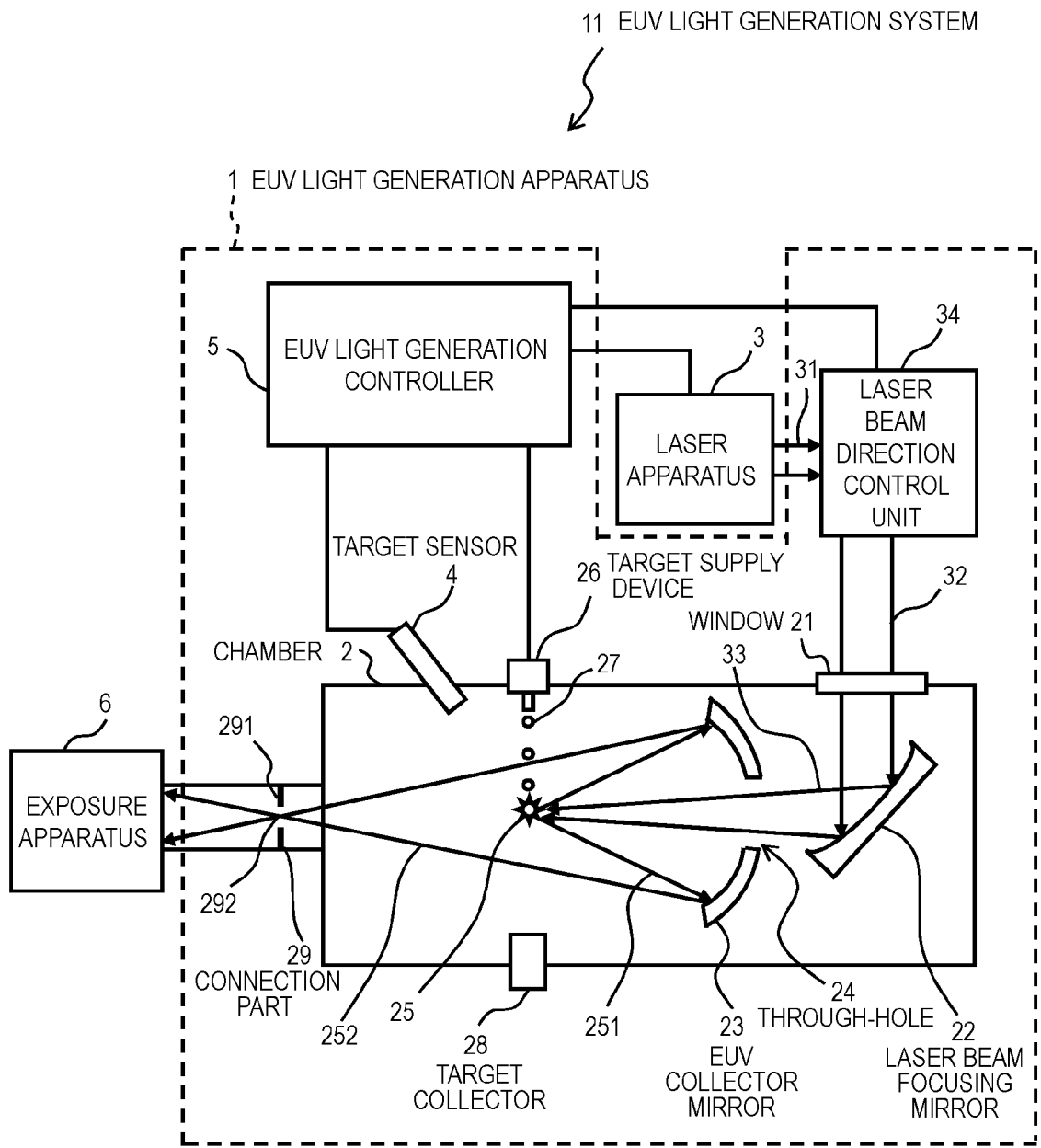
FIG. 1 schematically illustrates an exemplary configuration of an LPP type EUV light generation system.

<Contents>
1. Overview
2. Terms
3. Overview of EUV Light Generation System
   3.1 Configuration
   3.2 Operation
4. Laser Apparatus Including Master Oscillator and Optical Amplifiers
   4.1 Configuration
   4.2 Operation
   4.3 Issues of Self-Oscillation
5. Embodiment 1
   5.1 Configuration
   5.2 Operation
   5.3 Effects
   5.4 Others
6. Embodiment 2
   6.1 Configuration
   6.2 Operation
   6.3 Effects
7. Embodiment 3
   7.1 Configuration
   7.2 Operation
   7.3 Effects
8. Embodiment 4
   8.1 Configuration
   8.2 Operation
   8.3 Opening Angle
   8.4 Effects
9. Embodiment 5
   9.1 Configuration
   9.2 Operation
   9.3 Effects
10. Components of Optical Reflector and Optical Absorber
    10.1 Optically Reflective Material
    10.2 Surface Treatment of Optically Reflective Face
    10.3 Optically Absorptive Material
    10.4 Surface Treatment of Optically Absorptive Face
    10.5 Thermal regulation mechanism of Optical Absorber
11. Optical Amplifier
    11.1 Slab Amplifier in Which Optical Paths Intersect
    11.2 Slab Amplifier in Which Optical Paths Do Not Intersect
    11.3 Coaxial-Type Slab Amplifier
    11.4 Fast Axial Flow Amplifier
    11.5 Triaxial Cross Flow Amplifier
12. Optical Switch
13. Other Embodiments
    13.1 Issues
    13.2 Configurations and Operations
    13.3 Effects Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

1. Overview

An LPP type EUV light generation system may generate EUV light by irradiating a target material with a pulse laser beam to change the target material into plasma. The laser apparatus for outputting the laser beam may include a master oscillator for outputting a seed beam and an optical amplifier for amplifying the outputted seed beam. The laser apparatus may include a plurality of optical amplifiers.

In the laser apparatus, an amplified spontaneous emission (ASE) beam outputted from an optical amplifier may be amplified by another optical amplifier to generate a self-oscillation beam. The self-oscillation beam wastes the amplification gain of the optical amplifier to lower the amplification rate, so that the output power of the laser beam may be lowered. The self-oscillation beam may also damage the components on the optical path of the laser beam. The damage may encourage self-oscillation.

A laser apparatus of an aspect of the present disclosure may include a master oscillator and a plurality of optical amplifiers. The laser apparatus may include an optical reflector disposed on the optical paths of self-oscillation beams from an optical amplifier to reflect the self-oscillation beams without blocking a pulse laser beam and an optical absorber for receiving and absorbing the self-oscillation beams reflected by the optical reflector.

The optical reflector and the optical absorber may reduce the transmission of the self-oscillation beams in the laser apparatus. This effect may keep the amplification rate of the optical amplifier from being lowered, achieving amplification of a laser beam at high amplification efficiency. Further, the effect may lead to less fluctuation in output laser power, achieving stable amplification. Still further, the effect may reduce the damage in the optical components on optical path of the laser beam.

2. Terms

Terms used in the present disclosure will be described hereinafter. A "plasma generation region" may refer to a region where the generation of plasma for generating EUV light begins. It may be necessary for a target to be supplied to the plasma generation region and for a pulse laser beam to be focused at the plasma generation region at the timing at which the target reaches the plasma generation region in order for the generation of plasma to begin at the plasma generation region. An "optical switch" may include an optical shutter and an optical isolator. The optical switch may control whether to transmit or block a unidirectional light beam. The optical isolator may control whether to transmit or block light beams in opposite directions.

3. Overview of Euv Light Generation System

3.1 Configuration

FIG. 1 schematically illustrates an exemplary configuration of an LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply device 26.

The chamber 2 may be sealed airtight. The target supply device 26 may be mounted onto the chamber 2, for example, to penetrate a wall of the chamber 2. A target material to be supplied by the target supply device 26 may include, but is not limited to, tin, terbium, gadolinium, lithium, xenon, or any combination thereof.

The chamber 2 may have at least one through-hole formed in its wall, a window 21 may be installed in the through-hole, and the pulse laser beam 32 from the laser apparatus 3 may travel through the window 21. An EUV collector mirror 23 having a spheroidal surface may, for example, be provided in the chamber 2. The EUV collector mirror 23 may have a first focus and a second focus.

The EUV collector mirror 23 may have a multi-layered reflective film including alternately laminated molybdenum layers and silicon layers formed on the surface thereof. The EUV collector mirror 23 is preferably positioned such that the first focus lies in a plasma generation region 25 and the second focus lies in an intermediate focus (IF) region 292. The EUV collector mirror 23 may have a through-hole 24 formed at the center thereof and a pulse laser beam 33 may travel through the through-hole 24.

The EUV light generation apparatus 1 may include an EUV light generation controller 5 and a target sensor 4. The target sensor 4 may have an imaging function and detect at least one of the presence, trajectory, position, and speed of a target 27.

Further, the EUV light generation system 11 may include a connection part 29 for allowing the interior of the chamber 2 to be in communication with the interior of the exposure apparatus 6. A wall 291 having an aperture may be provided in the connection part 29. The wall 291 may be positioned such that the second focus of the EUV collector mirror 23 lies in the aperture.

The EUV light generation apparatus 1 may also include a laser beam direction control unit 34, a laser beam focusing mirror 22, and a target collector 28 for collecting targets 27. The laser beam direction control unit 34 may include an optical element for defining the direction and an actuator for adjusting the position, the orientation or posture, and the like of the optical element.

3.2 Operation

With reference to FIG. 1, a pulse laser beam 31 outputted from the laser apparatus 3 may pass through the laser beam direction control unit 34 and, as the pulse laser beam 32, travel through the window 21 and enter the chamber 2. The pulse laser beam 32 may travel inside the chamber 2 along at least one beam path, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam, the target 27 may be turned into plasma, and rays of light 251 may be emitted from the plasma.

The EUV light 252 included in the light 251 may be reflected selectively by the EUV collector mirror 23. EUV light 252 reflected by the EUV collector mirror 23 may be focused at the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control: the timing when the target 27 is outputted and the direction into which the target 27 is outputted, for example.

Furthermore, the EUV light generation controller 5 may be configured to control at least one of: the timing when the laser apparatus 3 oscillates, the direction in which the pulse laser beam 33 travels, and the position at which the pulse laser beam 33 is focused. It will be appreciated that the various controls mentioned above are merely examples, and other controls may be added as necessary.

4. Laser Apparatus Including Master Oscillator and Optical Amplifiers

4.1 Configuration

Figure 2A:
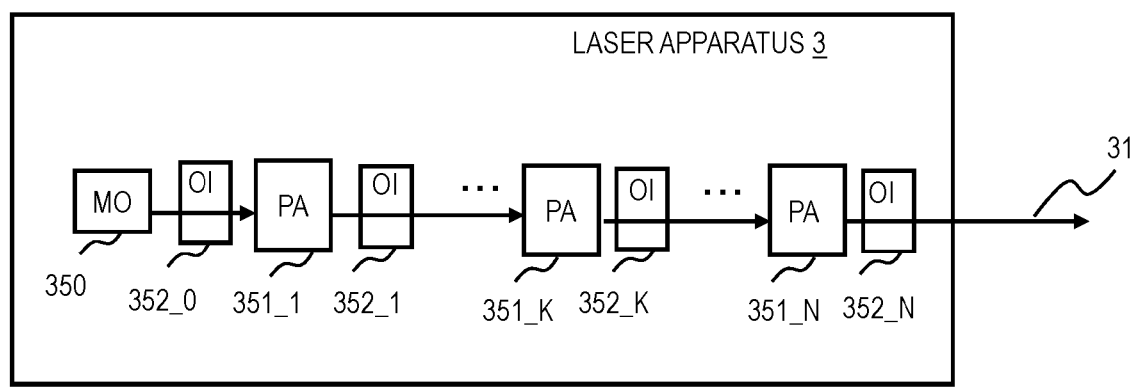
FIG. 2A illustrates a configuration example of a laser apparatus.

FIG. 2A illustrates a configuration example of a laser apparatus 3. The laser apparatus 3 may include a master oscillator (MO) 350, optical amplifiers (PA) 351_1 to 351_N, and optical isolators (OI) 352_0 to 352_N. Instead of the optical isolators, the laser apparatus 3 may include optical shutters as optical switches.

The master oscillator 350 may be a CO2 laser oscillator including a Q switch or a quantum-cascade laser (QCL) that oscillates in the amplification wavelength range of CO2 laser gas. The pulse laser beam outputted from the master oscillator 350 may be a linearly-polarized beam.

The optical amplifiers 351_1 to 351_N may be disposed in series on the optical path of the pulse laser beam outputted from the master oscillator 350 and sequentially amplify the pulse laser beam outputted from the master oscillator 350. The optical amplifiers 351_1 to 351_N may be the first-stage to the Nth-stage optical amplifiers. The number of stages for the optical amplifiers may be different depending on the design.

Figure 2B:
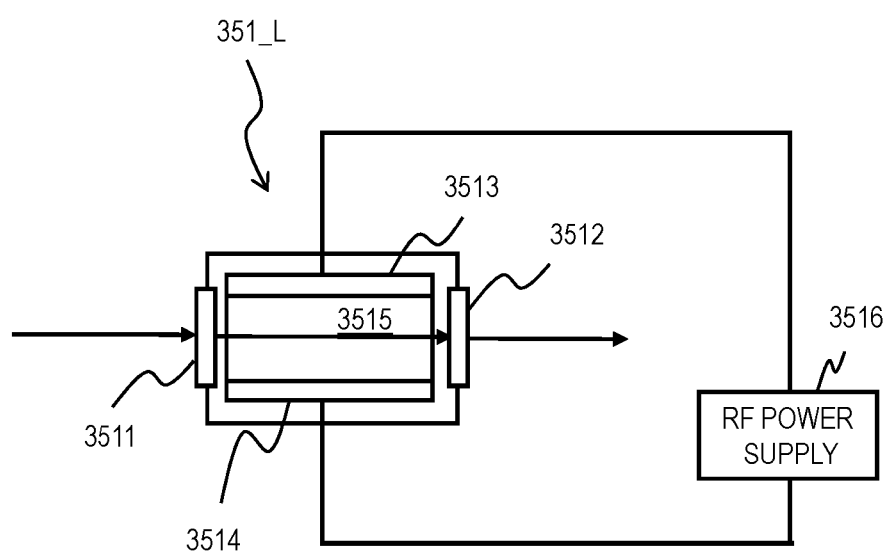
FIG. 2B illustrates a configuration example of an optical amplifier.

FIG. 2B illustrates a configuration example of an optical amplifier 351_L (L is any number of 1 to N). The optical amplifier 351_L may be a discharge-pumped amplifier including CO2 laser gas. The optical amplifier 351_L may include an input window 3511, an output window 3512, a pair of electrodes 3513 and 3514, and laser gas hermetically filled in a discharge region 3515.

An RF power supply 3516 may apply voltage between the electrodes 3513 and 3514 to excite the laser gas. A pulse laser beam received through the input window 351 may be amplified with the excited laser gas and outputted from the output window 352.

If the master oscillator 350 is a device for outputting a small power (in tens of milliwatts) like a QCL, the first-stage optical amplifier 351_1 may be a regenerative amplifier including an optical resonator, an EO (Electro-Optic) Pockels cell and a polarizer.

The optical isolators 352_0 to 352_N may be disposed at any or each of the places between the master oscillator 350 and the optical amplifier 351-1, between two adjacent optical amplifiers, and downstream of the optical amplifier 351_N on the optical path. The optical isolators 352_0 to 352_N may generate burst pulses to prevent reflection off targets 27 from reaching the master oscillator 350.

A part of the optical isolators 352_0 to 352_N may be omitted. For example, all the optical isolators downstream of the optical amplifier 351_L may be omitted if the optical amplifiers are not resistant to pulse laser beam. At least one optical isolator may be disposed at an upstream place where the pulse energy is low, for example, at least one of the places of between the master oscillator 350 and the optical amplifier 351_1, between the optical amplifiers 351_1 and 351_2, and between the optical amplifier 351_2 and 351_3.

4.2 Operation

Each of the optical amplifiers 351_1 to 351_N may apply voltage between the electrodes 3513 and 3514 with the RF power supply 3516 to excite the laser gas in the discharge region 3515. The master oscillator 350 may produce laser oscillation with a predetermined repetition frequency. The optical amplifiers 351_1 to 351_N may discharge electricity with their RF power supplies 3516 to excite laser gas even when not receiving a pulse laser beam from the master oscillator 350.

The pulse laser beam outputted from the master oscillator 350 may be amplified by entering the optical amplifier 351_1 and passing through the optical amplifier 351_1. The amplified pulse laser beam outputted from the optical amplifier 351_1 may be further amplified by entering the optical amplifier 351_2 and passing through the optical amplifier 351_2.

As noted from the above, the pulse laser beam outputted from the optical amplifier 351_K−1 (K is any number of 2 to N) may be further amplified by entering the optical amplifier 351_K and passing through the optical amplifier 351_K. The amplified pulse laser beam may be focused on a target 27 by a laser beam focusing mirror 22. The target 27 the pulse laser beam is focused on may turn into plasma, which may radiate EUV light.

4.3 Issues of Self-Oscillation

For example, an ASE beam emitted from the optical amplifier 351_K may travel toward the master oscillator 350 and be amplified by a plurality of optical amplifiers to become a self-oscillation beam. An ASE beam emitted from an optical amplifier and a self-oscillation beam derived from the ASE beam may be reflected by an optical element of the laser apparatus 3. The reflected ASE beam may travel in any direction depending on the reflective face of the optical element.

Figure 3:
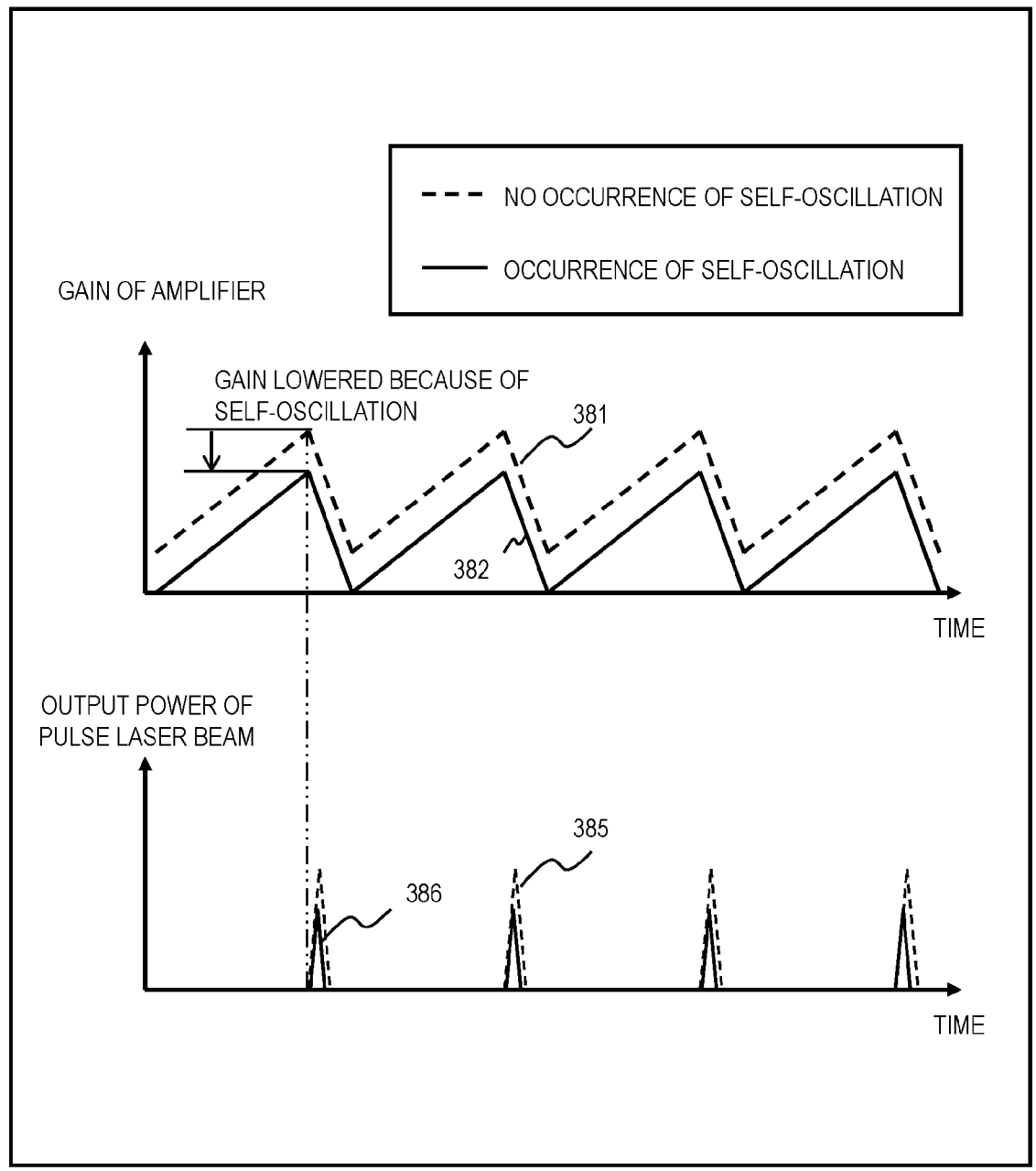
FIG. 3 schematically illustrates effects of a self-oscillation beam on the gain of an optical amplifier and on the output power of the pulse laser beam outputted from the optical amplifier.

FIG. 3 schematically illustrates effects of a self-oscillation beam on the gain of the optical amplifier 351_L and on the output power of the pulse laser beam outputted from the optical amplifier 351_L. In FIG. 3, the broken line 381 represents the gain when self-oscillation does not occur and the solid line 382 represents the gain when self-oscillation occurs. The broken line 385 represents the output power of the pulse laser beam outputted from the optical amplifier when self-oscillation does not occur and the solid line 386 represents the output power of the pulse laser beam outputted from the optical amplifier when self-oscillation occurs. As illustrated in FIG. 3, self-oscillation may lower the output power of the pulse laser beam by wasting the amplification gain of the optical amplifier 351_L to lower the amplification rate.

Meanwhile, if a self-oscillation beam enters the master oscillator 350, the self-oscillation beam may damage the optical components of the master oscillator 350. Furthermore, the self-oscillation beam may damage the end faces of the optical isolators 352_0 to 352_N. When the end faces of the optical isolators 352_0 to 352_N are damaged, the transmittance for the pulse laser beam around the damaged area may be lowered to attenuate the pulse laser beam and further, the absorption rate for the pulse laser beam around the damaged area may rise to cause heating of the element.

5. Embodiment 1

5.1 Configuration

Figure 4:
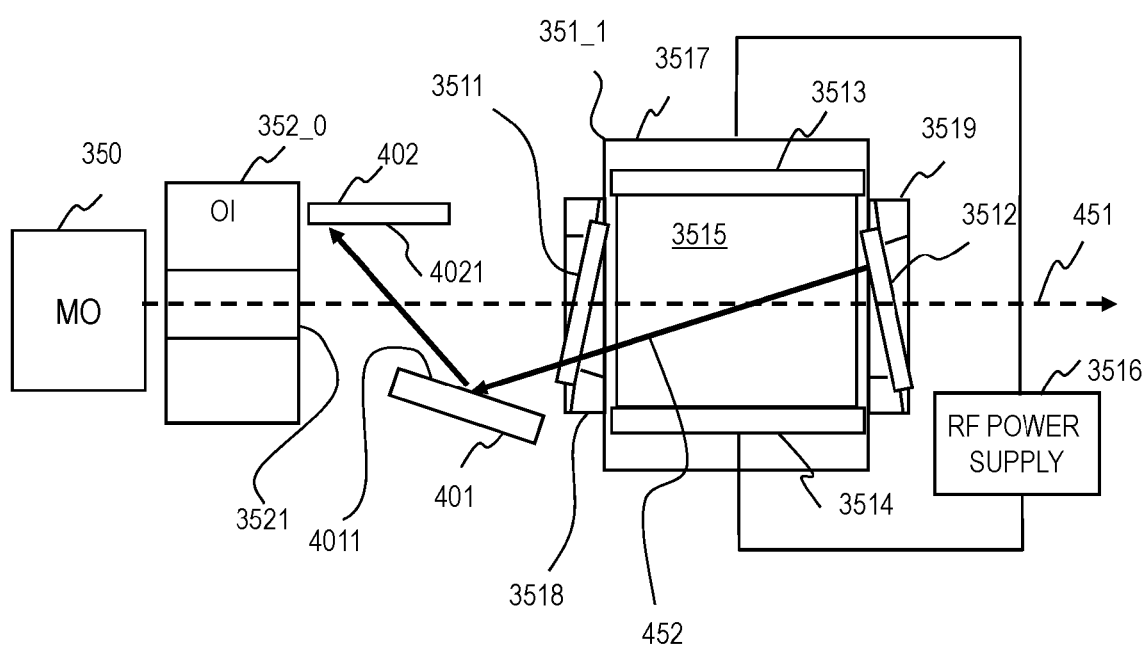
FIG. 4 schematically illustrates a configuration example of a part of a laser apparatus in Embodiment 1.

FIG. 4 schematically illustrates a configuration example of a part of a laser apparatus 3 in the present embodiment. The optical amplifier 351_1 may include components in a chamber 3517. An input window holder 3518 and an output window holder 3519 may be anchored to the chamber 3517. The input window holder 3518 and the output window holder 3519 may respectively hold an input window 3511 and an output window 3512.

In the optical amplifier 351_1, the input window 3511, the output window 3512, and the optical elements of a not-shown collimator optical system may be disposed in such an arrangement that a light beam will enter at an angle other than 90 degrees with respect to the optical axis of the pulse laser beam 451. This configuration may reduce the direct entry of self-oscillation beams to the optical isolators 352_0 and 352-1 upstream and downstream of the optical amplifier 351_1. The input window 3511 and the output window 3512 may be angled differently with respect to the optical axis of the pulse laser beam 451. The other optical amplifiers may have the same configuration.

FIG. 4 shows an example of a self-oscillation beam 452. An optical reflector 401 may be disposed on the traveling path of the self-oscillation beam 452 emitted from the optical amplifier 351_1. The optical reflector 401 may reflect at least a part of the self-oscillation beam 452. As illustrated in FIG. 4, the optical reflector 401 may be disposed between the optical isolator 352_0 and the optical amplifier 351_1.

The optical reflector 401 may be disposed at such a place that the optical reflector 401 will not block the traveling pulse laser beam 451. As shown in the example of FIG. 4, the optical reflector 401 may be disposed completely off the optical path of the pulse laser beam 451.

The optical reflector 401 may be a plate having a flat reflective face 4011. The reflective face 4011 may be curved. The reflective face 4011 may be tilted toward the optical amplifier 351_1 that outputs the self-oscillation beam 452. The angle between the direction of the normal at the center of the reflective face 4011 and the traveling direction of the pulse laser berm 451 may be an acute angle larger than 0 degrees and smaller than 90 degrees. The structures of the optical reflector 401 and the reflective face 4011 will be described later in detail.

An optical absorber 402 may be disposed at such a place that the optical absorber 402 will receive the self-oscillation beam 452 reflected by the optical reflector 401. The optical absorber 402 may directly receive the self-oscillation beam 452 reflected by the optical reflector 401. The self-oscillation beam 452 reflected by the optical reflector 401 may hit the optical absorber 402 without being reflected by another element and being transmitted through another element. The optical absorber 402 may indirectly receive the self-oscillation beam 452 reflected by the optical reflector 401 via another element.

As shown in FIG. 4, the optical absorber 402 may be disposed between the optical isolator 352_0 and the optical reflector 401. The optical absorber 402 may be disposed on the opposite side of the optical reflector 401 with respect to the optical path of the pulse laser beam 451. The optical absorber 402 may be disposed on the same side of the optical reflector 401 with respect to the optical path of the pulse laser beam 451.

The optical absorber 402 may be disposed at such a place that the optical absorber 402 will not block the traveling pulse laser beam 451. As shown in the example of FIG. 4, the optical absorber 402 may be disposed completely off the optical path of the pulse laser beam 451.

The optical absorber 402 may be a plate having a flat or curved absorptive face 4021. The absorptive face 4021 may absorb at least a part of the self-oscillation beam 452 reflected by the optical reflector 401. The optical absorber 402 and the absorptive face 4021 will be described later in detail.

5.2 Operation

The pulse laser beam 451 outputted from the master oscillator 350 may pass through the outlet 3521 of the optical isolator 352_0 and be amplified by the optical amplifier 351_1. ASE beams reflected off the output window 3512 or inputted through the output window 3512 may be amplified by the excited laser gas to become self-oscillation beams 452.

A part of the self-oscillation beams 452 may pass through the input window 3511 to be outputted on the side of the optical isolator 352_0. The self-oscillation beams 452 that have passed through the input window 3511 travel toward the optical reflector 401 and are reflected off the reflective face 4011. In the example of FIG. 4, the reflective face 4011 may reflect the self-oscillation beams 452 emitted from the optical amplifier 351_1 in a direction away from the outlet 3521 of the optical isolator 352_0.

The reflective face 4011 may reflect the self-oscillation beams 452 toward the optical absorber 402. The absorptive face 4021 of the optical absorber 402 may absorb the self-oscillation beams 452 reflected off the reflective face 4011.

5.3 Effects

Reflecting the self-oscillation beams 452 emitted from the optical amplifier 351_1 using the optical reflector 401 and absorbing the reflected self-oscillation beam 452 using the optical absorber 402 may reduce the damage to the end face of the optical isolator 352_0. Particularly, in the case where the traveling paths of the self-oscillation beams 452 are predictable, a simple configuration using a planar optical reflector 401 disposed on the paths and a planar optical absorber 402 may reduce the transmission of the self-oscillation beams 452. The optical reflector 401 and the optical absorber 402 may reduce the transmission of ASE beams as well as the transmission of the self-oscillation beams 452. The optical absorber 402 may reduce the entry of the beams reflected off the optical reflector 401 to the discharge region (amplification region) of any of the optical amplifiers.

5.4 Others

The optical reflector 401 and the optical absorber 402 in the present embodiment may be disposed at such places that the optical reflector 401 will reflect and the optical absorber 402 will absorb the self-oscillation beams 452 emitted from each of the other optical amplifiers 351_2 to 351_N. The optical reflector 401 and the optical absorber 402 may be disposed between the output of an optical amplifier and the input of an optical isolator, between optical amplifiers in a configuration including no optical isolator, or between an optical amplifier and a master oscillator in a configuration including no optical isolator. The same may apply to the other embodiments.

6. Embodiment 2

Hereinafter, Embodiment 2 will be described. Described in the present embodiment are mainly differences from Embodiment 1.

6.1 Configuration

Figure 5A:
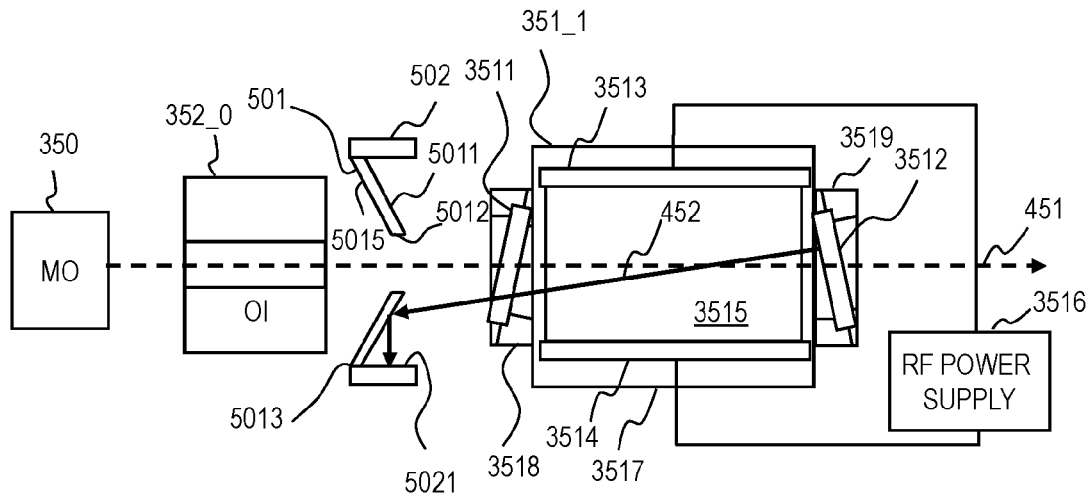
FIG. 5A schematically illustrates a configuration example of a part of a laser apparatus in Embodiment 2.
Figure 5B:
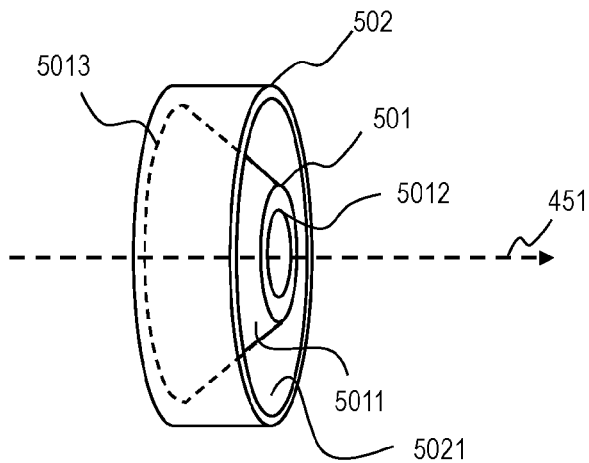
FIG. 5B is a perspective diagram of an optical reflector and an optical absorber in FIG. 5A.

FIG. 5A schematically illustrates a configuration example of a part of a laser apparatus 3 in the present embodiment. FIG. 5B is a perspective diagram of the optical reflector 501 and the optical absorber 502 in FIG. 5A. As shown in FIG. 5A and FIG. 5B, the optical reflector 501 and the optical absorber 502 may be formed as a single component. The optical reflector 501 and the optical absorber 502 may be formed separately.

The optical reflector 501 may be shaped like a hollow cone. The optical reflector 501 may have a top aperture 5012 and a bottom aperture 5013. The inner and outer diameters of the optical reflector 501 may gradually decrease from the bottom aperture 5013 toward the top aperture 5012. The outer face 5011 of the optical reflector 501 may be a reflective face capable of reflecting self-oscillation beams 452. The outer face 5011 of the optical reflector 501 may face the optical amplifier 351_1. The inner face 5015 of the optical reflector 501 may face the optical isolator 352_0.

The central axis of the optical reflector 501 may lie along the optical axis of the pulse laser beam 451. The top aperture 5012 may face the optical amplifier 351_1. The bottom aperture 5013 may face the optical isolator 352_0. The top aperture 5012 and the bottom aperture 5013 may pass the pulse laser beam 451 therethrough.

The optical absorber 502 may be shaped like a hollow cylinder. The shape of the optical absorber 502 may have a tubular shape different from a hollow cylinder. The optical absorber 502 may hold the optical reflector 501 therein. The optical absorber 502 may share the central axis with the optical reflector 501. The inner face 5021 of the optical absorber 502 may be an absorptive face. The absorptive face 5021 may face the reflective face 5011 of the optical reflector 501. The absorptive face 5021 may absorb the self-oscillation beams 452 reflected off the reflective face 5011 of the optical reflector 501.

The inner diameter of the optical reflector 501 may not decrease from the bottom aperture 5013 toward the top aperture 5012. For example, the inner diameter of the optical reflector 501 may be uniform in the direction of the central axis. In a cross-section of the optical reflector 501 perpendicular to the central axis, the inner face 5011 may have a shape different from a circle, for example, an oval. Likewise, in a cross-section of the optical reflector 502 perpendicular to the central axis, the inner face 5021 may have a shape different from a circle, for example, an oval. The inner diameter of the optical absorber 502 may vary in the direction of the central axis.

6.2 Operation

The pulse laser beam 451 outputted from the master oscillator 350 may pass through the bottom aperture 5013 and the top aperture 5012 of the optical reflector 501 and enter the optical amplifier 351_1. A self-oscillation beam 452 of the optical amplifier 351_1 may pass through the input window 3511 on the side of the optical isolator 352_0 to be outputted. The self-oscillation beam 452 that has passed through the input window 3511 may be reflected off the reflective face 5011 of the optical reflector 501.

The self-oscillation beam 452 reflected off a convex face, the outer face 5011, may travel away from the optical reflector 501 while diffusing in the radial direction of the cone. The self-oscillation beam 452 reflected off the reflective face 5011 may be absorbed by the inner face 5021 of the optical absorber 502.

6.3 Effects

The present embodiment may absorb self-oscillation beams 452 traveling in various directions more reliably by using a hollow optical reflector 501 and a hollow optical absorber 502. Furthermore, the present embodiment may cause less damage to the absorptive face 5021. Specifically, the outer face 5011 of the conical optical reflector 501 is curved. The self-oscillation beams 452 reflected off the outer face 5011 of the cone travel away from the optical reflector 501 while diffusing in the radial direction of the cone. The diffusion may lower the energy density of the self-oscillation beams 452, causing less damage to the absorptive face 5021. As a result, the self-oscillation beams 452 reflected by the optical absorber 502 may be reduced.

7. Embodiment 3

Hereinafter, Embodiment 3 will be described. Described in the present embodiment are mainly differences from the foregoing embodiments.

7.1 Configuration

Figure 6:
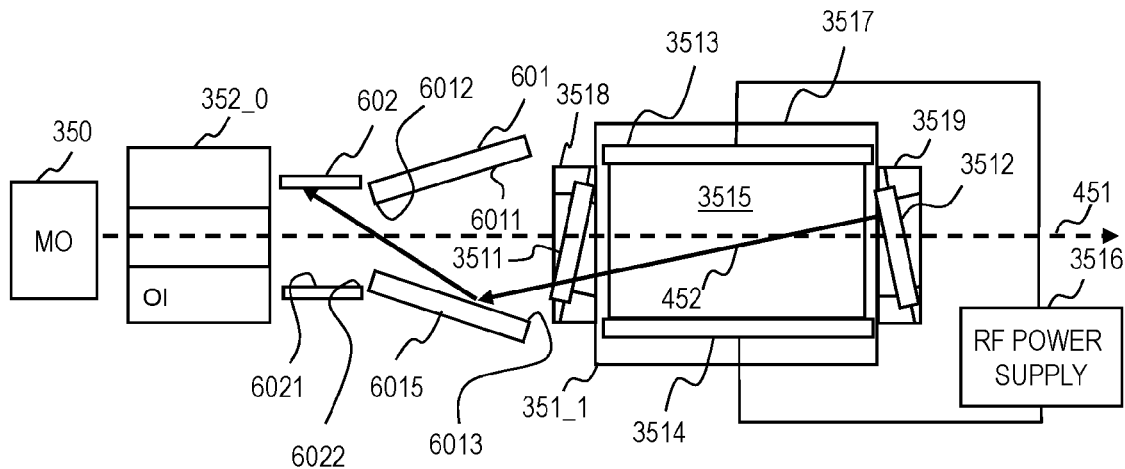
FIG. 6 schematically illustrates a configuration example of a part of a laser apparatus in Embodiment 3.

FIG. 6 schematically illustrates a configuration example of a part of a laser apparatus 3 in the present embodiment. As shown in FIG. 6, the optical reflector 601 and the optical absorber 602 may be separate. The optical reflector 601 and the optical absorber 602 may be formed as a single component.

The optical reflector 601 may be shaped like a hollow cone. The optical reflector 601 may have a top aperture 6012 and a bottom aperture 6013. The diameter of the top aperture 6012 may be smaller than the diameter of the bottom aperture 6013. The inner face 6011 of the optical reflector 601 may be a reflective face capable of reflecting self-oscillation beams 452. The inner face 6011 of the optical reflector 601 may face the optical amplifier 351_1. The outer face 6015 of the optical reflector 601 may face the optical isolator 352_0.

The central axis of the optical reflector 601 may lie along the optical axis of the pulse laser beam 451. The top aperture 6012 may face the optical isolator 352_0. The bottom aperture 6013 may face the optical amplifier 351_1. The top aperture 6012 and the bottom aperture 6013 may pass the pulse laser beam 451 therethrough.

The optical absorber 602 may be disposed between the optical reflector 601 and the optical isolator 352_0. The optical absorber 602 may be disposed adjacent to the optical reflector 601. The optical absorber 602 may be shaped like a hollow cylinder. The optical absorber 602 may have a tubular shape different from a hollow cylinder. An aperture 6022 of the optical absorber 602 may face the top aperture 6012 of the optical reflector 601. The central axis of the optical absorber 602 may lie along the optical axis of the pulse laser beam 451. The pulse laser beam 451 may pass through the optical absorber 602.

The inner face 6021 of the optical absorber 602 may be an absorptive face. The absorptive face 6021 may absorb self-oscillation beams 452 reflected off the reflective face 6011 of the optical reflector 601. The diameter of the aperture 6022 of the optical absorber 602 may be larger than the diameter of the aperture 6012 of the optical reflector 601 so that the optical absorber 602 receives reflection more reliably from optical reflector 601.

The outer diameter of the optical reflector 601 may not gradually decrease from the bottom aperture 6013 toward the top aperture 6012. For example, the outer diameter of the optical reflector 601 may be uniform in the direction of the central axis. In a cross-section of the optical reflector 601 perpendicular to the central axis, the inner face 6011 may have a shape of an oval, instead of a circle. In a cross-section of the optical absorber 602 perpendicular to the central axis, the inner face 6021 may have a shape of an oval, instead of a circle. The inner diameter of the optical absorber 602 may vary in the direction of the central axis.

7.2 Operation

The pulse laser beam 451 outputted from the master oscillator 350 may pass through the optical absorber 602 and the optical reflector 601 and enter the optical amplifier 351_1. A self-oscillation beam 452 of the optical amplifier 351_1 may pass through the input window 3511 on the side of the optical isolator 352_0 to be outputted. The self-oscillation beam 452 that has passed through the input window 3511 may be reflected off the reflective face 6011 being the inner face of the optical reflector 601.

The self-oscillation beam 452 reflected off a concave face, the inner face 6011 of the optical reflector 601, may converge and then diffuse in the radial direction of the cone while travelling. The self-oscillation beam 452 reflected off the optically reflective face 6011 may be absorbed to the inner face 6021 of the optical absorber 602.

7.3 Effects

The present embodiment may absorb self-oscillation beams 452 traveling in various directions more reliably by using a hollow optical reflector 601 and a hollow optical absorber 602. Furthermore, the present embodiment may cause less damage to the absorptive face 6021. Specifically, the inner face 6011 of the conical optical reflector 601 is curved. Self-oscillation beams 452 reflected off the inner face 6011 of the cone may converge and then diffuse in the radial direction of the cone while travelling. As a result, the energy densities of the self-oscillation beams 452 may be lowered to cause less damage to the absorptive face 6021.

8. Embodiment 4

Hereinafter, Embodiment 4 will be described. Described in the present embodiment are mainly differences from the foregoing embodiments.

8.1 Configuration

Figure 7A:
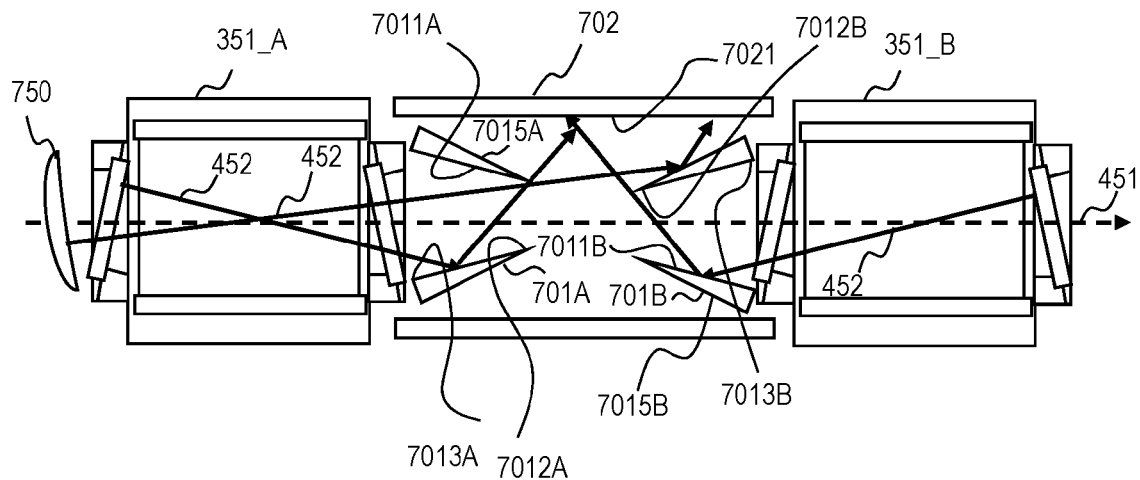
FIG. 7A schematically illustrates a configuration example of a part of a laser apparatus in Embodiment 4.

FIG. 7A schematically illustrates a configuration example of a part of a laser apparatus 3 in the present embodiment. As shown in FIG. 7A, a first optical reflector 701A, a second optical reflector 701B, and an optical absorber 702 may be disposed between the first optical amplifier 351_A and the second optical amplifier 351_B. The first optical reflector 701A, the second optical reflector 701B, and the optical absorber 702 may be separate components or otherwise, formed as a single component.

A lens 750 may be disposed on the input side of the first optical amplifier 351_A. No optical isolator may be provided between the first optical amplifier 351_A and the second optical amplifier 351_B. The first optical amplifier 351_A and the second optical amplifier 351_B may have the same configuration as the optical amplifiers in the foregoing embodiments; description thereof is omitted in this section.

The first optical reflector 701A may be disposed between the first optical amplifier 351_A and the second optical reflector 701B. The first optical reflector 701A may be shaped like a hollow cone. The first optical reflector 701A may have a top aperture 7012A and a bottom aperture 7013A. The outer diameter and the inner diameter of the first optical reflector 701A may gradually decrease from the bottom aperture 7013A toward the top aperture 7012A.

The inner face 7011A and the outer face 7015A of the first optical reflector 701A may be reflective faces capable of reflecting self-oscillation beams 452. The outer face 7015A of the first optical reflector 701A may face the second optical amplifier 351_B. The inner face 7011A of the first optical reflector 701A may face the first optical amplifier 351_A.

The central axis of the first optical reflector 701A may lie along the optical axis of the pulse laser beam 451. The top aperture 7012A may face the second optical amplifier 351_B. The bottom aperture 7013A may face the first optical amplifier 351_A. The top aperture 7012A and the bottom aperture 7013A may pass the pulse laser beam 451 therethrough.

The second optical reflector 701B may be disposed between the first optical reflector 701A and the second optical amplifier 351_B. The second optical reflector 701B may be shaped like a hollow cone. The second optical reflector 701B may have a top aperture 7012B and a bottom aperture 7013B. The outer diameter and the inner diameter of the second optical reflector 701B may gradually decrease from the bottom aperture 7013B toward the top aperture 7012B.

The inner face 7011B and the outer face 7015B of the second optical reflector 701B may be reflective faces capable of reflecting self-oscillation beams 452. The outer face 7015B of the second optical reflector 701B may face the first optical amplifier 351_A. The inner face 7011B of the second optical reflector 701B may face the second optical amplifier 351_B.

The central axis of the second optical reflector 701B may lie along the optical axis of the pulse laser beam 451. The top aperture 7012B may face the first optical amplifier 351_A. The bottom aperture 7013B may face the second optical amplifier 351_B. The top aperture 7012B and the bottom aperture 7013B may pass the pulse laser beam 451 therethrough.

The optical absorber 702 may be shaped like a hollow cylinder. The optical absorber 702 may have a tubular shape different from a hollow cylinder. The optical absorber 702 may hold the first optical reflector 701A and the second optical reflector 701B therein. The optical absorber 702 may share the central axis with the first optical reflector 701A and the second optical reflector 701B.

The inner face 7021 of the optical absorber 702 may be an absorptive face. The absorptive face 7021 may face the outer face 7015A of the first optical reflector 701A and the outer face 7015B of the second optical reflector 701B. The absorptive face 7021 may absorb self-oscillation beams 452 reflected off the reflective face 7011A or 7015A of the first optical reflector 701A. The absorptive face 7021 may absorb self-oscillation beams 452 reflected off the reflective face 7011B or 7015B of the second optical reflector 701B.

In cross-sections of the first optical reflector 701A and the second optical reflector 701B perpendicular to the central axis, their inner faces and outer faces may have shapes different from circles, for example ovals. Likewise, in a cross-section of the optical absorber 702 perpendicular to the central axis, the inner face 7021 may have a shape different from a circle, for example an oval. The inner diameter of the optical absorber 702 may vary in the direction of the central axis.

8.2 Operation

The pulse laser beam 451 from the first optical amplifier 351_A may pass through the first and the second optical reflectors 701A and 701B, and the optical absorber 702 and enter the second optical amplifier 351_B. Self-oscillation beam 452 emitted from the first optical amplifier 351_A and traveling toward the second optical amplifier 351_B may be reflected off the inner face 7011A of the first optical reflector 701A or the outer face 7015B of the second optical reflector 701B. Self-oscillation beams 452 emitted from the second optical amplifier 351_B and traveling toward the first optical amplifier 351_A may be reflected off the inner face 7011B of the second optical reflector 701B or the outer face 7015A of the first optical reflector 701A.

The self-oscillation beams 452 reflected off a convex face, the outer face 7015A of the first optical reflector 701A or the outer face 7015B of the second optical reflector 701B, may diffuse while traveling. The self-oscillation beams 452 reflected off a concave face, the inner face 7011A of the first optical reflector 701A or the inner face 7011B of the second optical reflector 701B, may converge and then diffuse while traveling. The self-oscillation beams 452 reflected by the first optical reflector 701A and the second optical reflector 701B may be absorbed to the inner face 7021 of the optical absorber 702.

8.3 Opening Angle

Figure 7B:
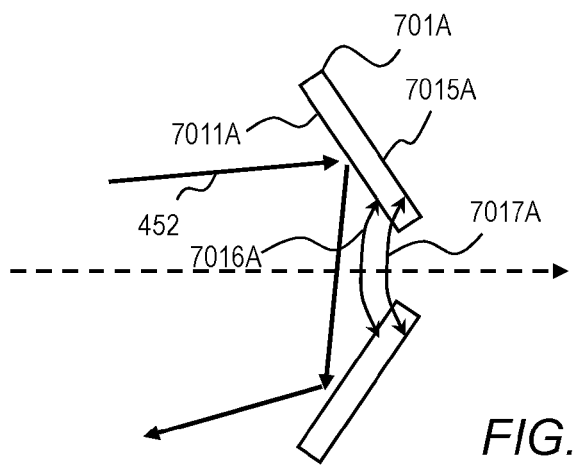
FIG. 7B schematically illustrates opening angles of the outer face and the inner face of a first optical reflector.
Figure 7C:
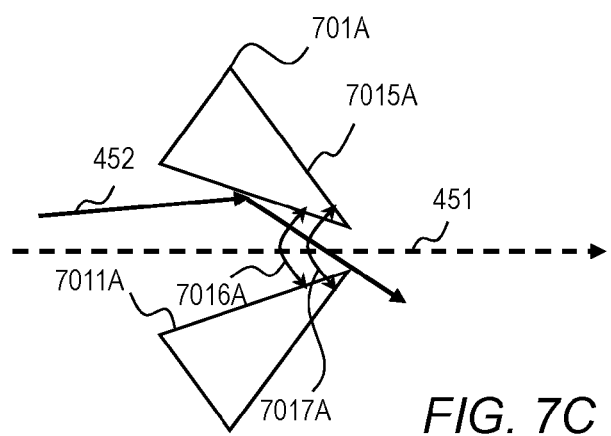
FIG. 7C schematically illustrates opening angles of the outer face and the inner face of a first optical reflector.

FIGS. 7B and 7C schematically illustrate relations between the opening angle of the outer face 7015A of the first optical reflector 701A and the opening angle of the inner face 7011A of the first optical reflector 701A. As shown in FIG. 7B, the opening angle 7016A of the inner face 7011A may be the same as the opening angle 7017A of the outer face 7015A.

As shown in FIG. 7C, the opening angle 7016A of the inner face 7011A may be different from the opening angle 7017A of the outer face 7015A. Specifically, the opening angle 7016A of the inner face 7011A may be smaller than the opening angle 7017A of the outer face 7015A. As shown in FIG. 7C, the thickness of the first optical reflector 701A may gradually decrease from the bottom aperture 7013A toward the top aperture 7012A. That is to say, the decreasing rate of the outer diameter may be greater than the decreasing rate of the inner diameter.

As shown in FIG. 7C, the rim of the top aperture 7012A of the first optical reflector 701A may be sharp-angled. Likewise, the rim of the bottom aperture 7013A of the first optical reflector 701A may be sharp-angled. The configuration described with reference to FIGS. 7B and 7C may apply to the second optical reflector 701B.

8.4 Effects

The present embodiment may effectively reduce transmission of the self-oscillation beams 452 emitted from the first optical amplifier 351_A and the second optical amplifier 351_B. The present embodiment may increase the incident angles of the self-oscillation beams to hit the inner faces 7011A and 7011B of the optical reflectors 701A and 701B by defining the opening angles of the inner faces 7011A and 7011B of the optical reflectors 701A and 701B as smaller than the opening angles of the outer faces 7015A and 7015B. This structure may pass more self-oscillation beams 452 that have passed through the bottom apertures 7013A or 7013B and have been reflected off the inner faces 7011A or 7011B through the top apertures 7012A or 7012B.

The sharp-angled rims of the top apertures 7012A and 7012B and/or bottom apertures 7013A and 7013B of the optical reflectors 701A and 701B may prevent self-oscillation beams 452 from being reflected off the end faces of the optical reflectors 701A and 701B at an incident angle of approximately 0 degrees to enter the first optical amplifier 351_A or the second optical amplifier 351_B, controlling the reflection directions of the self-oscillation beams 452 more effectively.

9. Embodiment 5

Hereinafter, Embodiment 5 will be described. Described in the present embodiment are mainly differences from the foregoing embodiments.

9.1 Configuration

Figure 8:
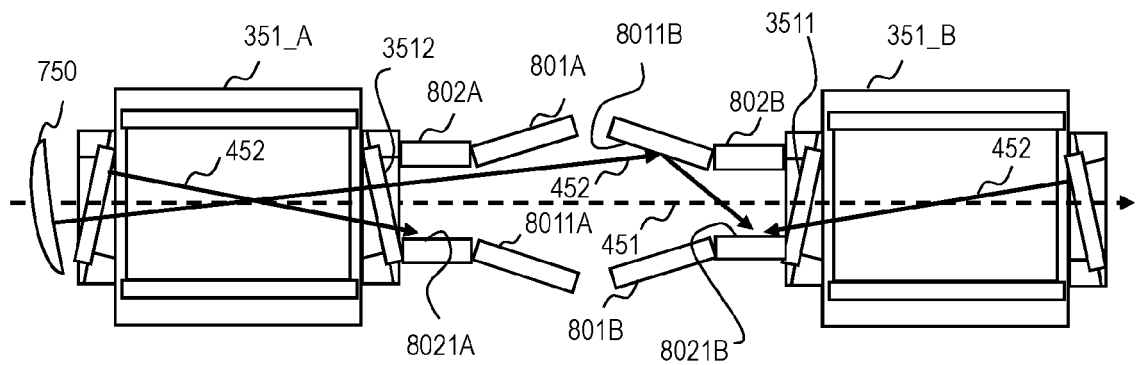
FIG. 8 schematically illustrates a configuration example of a part of a laser apparatus in Embodiment 5.

FIG. 8 schematically illustrates a configuration example of a part of a laser apparatus 3 in the present embodiment. As shown in FIG. 8, a first optical reflector 801A, a second optical reflector 801B, a first optical absorber 802A, and a second optical absorber 802B may be disposed between the first optical amplifier 351_A and the second optical amplifier 351_B. The first optical reflector 801A and the first optical absorber 802A may be formed as separate components or a single component. The second optical reflector 801B and the second optical absorber 802B may be formed as separate components or a single component.

The first optical absorber 802A may be disposed between the first optical amplifier 351_A and the first optical reflector 801A. The first optical reflector 801A may be disposed between the first optical absorber 802A and the second optical reflector 801B. The second optical reflector 801B may be disposed between the first optical reflector 801A and the second optical absorber 802B. The second optical absorber 802B may be disposed between the second optical reflector 801B and the second optical amplifier 351_B.

The first optical absorber 802A may be disposed adjacent to the output window 3512 of the first optical amplifier 351_A. The first optical reflector 801A may be disposed adjacent to the first optical absorber 802A. The second optical absorber 802B may be disposed adjacent to the input window 3511 of the second optical amplifier 351_B. The second optical reflector 801B may be disposed adjacent to the second optical absorber 802B.

The first optical reflector 801A may be shaped like a hollow cone. The inner diameter of the first optical reflector 801A may gradually decrease from the bottom aperture toward the top aperture. The inner face 8011A of the first optical reflector 801A may be a reflective face capable of reflecting self-oscillation beams 452. The inner face 8011A of the first optical reflector 801A may face the second optical amplifier 351_B. The central axis of the first optical reflector 801A may lie along the optical axis of the pulse laser beam 451. The bottom aperture of the first optical reflector 801A may face the second optical amplifier 351_B.

The first optical absorber 802A may be shaped like a hollow cylinder. The first optical absorber 802A may have a tubular shape different from a hollow cylinder. The central axis of the first optical absorber 802A may lie along the optical axis of the pulse laser beam 451. The inner face 8021A of the first optical absorber 802A may be an absorptive face. The relation between the first optical reflector 801A and the first optical absorber 802A may be similar to the relation between the optical reflector 601 and the optical absorber 602 in Embodiment 3.

The second optical reflector 801B may be shaped like a hollow cone. The inner face 8011B of the second optical reflector 801B may be a reflective face capable of reflecting self-oscillation beams 452. The inner diameter of the second optical reflector 801B may gradually decrease from the bottom aperture toward the top aperture. The inner face 8011B of the second optical reflector 801B may face the first optical amplifier 351_A. The central axis of the second optical reflector 801B may lie along the optical axis of the pulse laser beam 451. The bottom aperture of the second optical reflector 801B may face the first optical amplifier 351_A.

The second optical absorber 802B may be shaped like a hollow cylinder. The second optical absorber 802B may have a tubular shape different from a hollow cylinder. The central axis of the second optical absorber 802B may lie along the optical axis of the pulse laser beam 451. The inner face 8021B of the second optical absorber 802B may be an absorptive face. The second optical reflector 801B and the second optical absorber 802B may be symmetric to the first optical reflector 801A and the first optical absorber 802A.

The outer diameters of the optical reflectors 801A and 801B may not decrease from the bottom aperture toward the top aperture. For example, the outer diameters of the optical reflectors 801A and 801B may be uniform in the direction of the central axis. In cross-sections of the optical reflectors 801A and 801B perpendicular to the central axis, their inner faces may have shapes of ovals, instead of circles. Likewise, in cross-sections of the optical absorbers 802A and 802B perpendicular to the central axis, their inner faces may have shapes of ovals, instead of circles. The inner diameters of the optical absorbers 802A and 802B may vary in the direction of the central axis.

9.2 Operation

The pulse laser beam 451 from the first optical amplifier 351_A may pass through the first optical absorber 802A, the first optical reflector 801A, the second optical reflector 801B, and the second optical absorber 802B to enter the second optical amplifier 351_B. Self-oscillation beams 452 traveling from the first optical amplifier 351_A toward the second optical amplifier 351_B may be reflected off the inner face 8011B of the second optical reflector 801B. Self-oscillation beams 452 traveling from the second optical amplifier 351_B toward the first optical amplifier 351_A may be reflected off the inner face 8011A of the first optical reflector 801A.

The self-oscillation beams 452 reflected off a concave face, the inner face 8011A of the first optical reflector 801A or the inner face 8011B of the second optical reflector 801B, may converge and then diffuse while traveling. The self-oscillation beams 452 reflected by the first optical reflector 801A may be absorbed to the inner face 8021A of the first optical absorber 802A. The self-oscillation beams 452 reflected by the second optical reflector 801B may be absorbed to the inner face 8021B of the second optical absorber 802B. The first optical absorber 802A and the second optical absorber 802B may respectively absorb the self-oscillation beams 452 directly received from the first optical amplifier 351_A and the second optical amplifier 351_B.

9.3 Effects

The present embodiment may achieve more effective control of the reflection directions of self-oscillation beams 452 since the end faces of the optical reflectors 801A and 801B are less irradiated with the self-oscillation beams 452 from the first optical amplifier 351_A and the second optical amplifier 351_B.

10. Components of Optical Reflector and Optical Absorber

10.1 Optically Reflective Material

Regarding an optical reflector, the entirety thereof may be made of an optically reflective material capable of reflecting self-oscillation beams or otherwise, the body may have a reflective layer made of a reflective material capable of reflecting self-oscillation beams on the surface of the body. For the optically reflective material capable of reflecting self-oscillation beams, metals such as Al, Au, and Cu may be used. The optically reflective material may reflect light having at least a part of the wavelengths of the self-oscillation beams.

10.2 Surface Treatment of Optically Reflective Face

The reflective face of the optical reflector may be polished. A coating may be applied to the reflective face to raise the reflectance. The coating may be a film formed by alternately stacking two kinds of films having different refractive indices. For example, the high refractive material may be ZnSe or ZnS and the low refractive material may be ThF4 or PbF2. A desired spectral reflectivity may be obtained by coordinating the film thicknesses of the high refractive material and the low refractive material. In the case of employment of coating, the substrate for the optical reflector may be of ZnSe or diamond. Surface-polished ZnSe or diamond may also be used as optically refractive material, if the incident angles of the self-oscillation beams are large.

10.3 Optically Absorptive Material

Regarding the optical absorber, the entirety thereof may be made of an optically absorptive material capable of absorbing self-oscillation beams or otherwise, the body may have an absorption layer made of an optically absorptive material capable of absorbing self-oscillation beams on the surface of the body. For the optically absorptive material, metals such as Al and Cu, and further, Si, GaAs, ZnSe, and diamond may be used. The optically absorptive material may absorb light having at least a part of the wavelengths of the self-oscillation beams.

10.4 Surface Treatment of Optically Absorptive Face

Figure 9A:
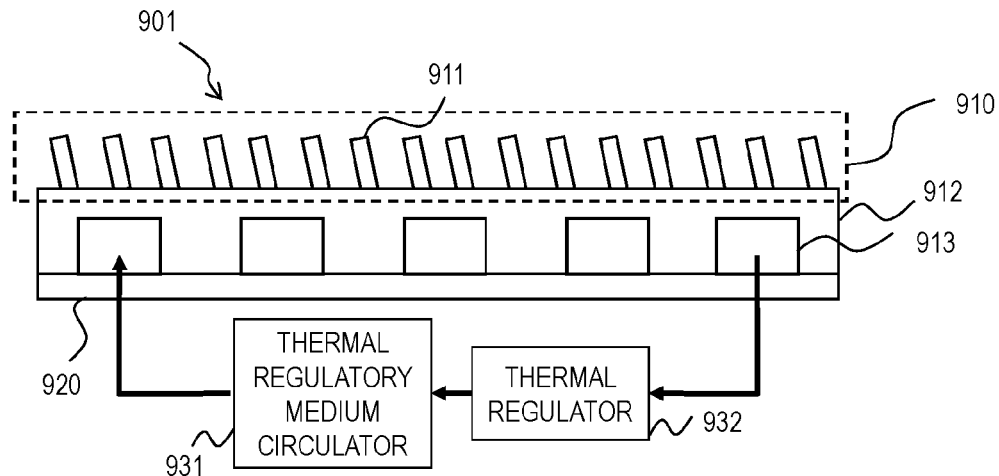
FIG. 9A schematically illustrates a configuration example of an optical absorber.
Figure 9B:
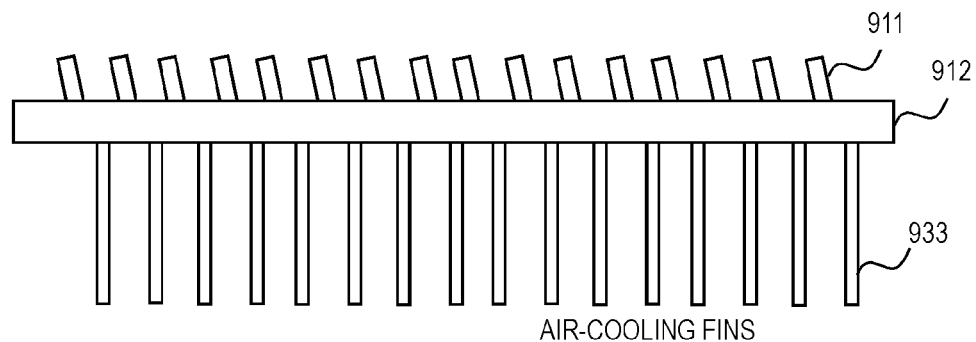
FIG. 9B schematically illustrates a configuration example of an optical absorber.

FIGS. 9A and 9B illustrate configuration examples of the optical absorber 901. The optical absorber 901 may include a substrate 912 and an absorptive face 910 formed of an optically absorptive material. The absorptive face 910 may have fins 911. The fins 911 may reduce diffusion of the reflection. The absorptive face 910 may be finished by sandblasting to have a surface having a specific roughness. This structure may increase the absorbance.

A coating may be applied to the absorptive face 910 to raise the absorbance. The coating may be of alumite, for example. Alternatively, the coating may be a film formed by alternately stacking two kinds of films having different refractive indices. For example, the high refractive material may be ZnSe or ZnS and the low refractive material may be ThF4 or PbF2. An antireflection film may be formed by coordinating the film thicknesses of the high refractive material and the low refractive material.

10.5 Thermal Regulation Mechanism for Optical Absorber

As illustrated in FIGS. 9A and 9B, the optical absorber 901 may have a thermal regulation mechanism. As shown in FIG. 9A, the thermal regulation mechanism may include thermal regulatory medium channels 913 formed in the optical absorber 901, a thermal regulatory medium circulator 931, and a thermal regulator 932. The thermal regulation mechanism discharges the heat caused by absorption of light from the optical absorber 901 to prevent overheat of the optical absorber 901. Alternatively, as illustrated in FIG. 9B, the thermal regulation mechanism may provide air-cooling fins 933 on a side different from the absorptive face 910.

11. Optical Amplifier

Hereinafter, variations of the optical amplifier 351_L will be described. The laser apparatus 3 may employ any type of the optical amplifiers described hereinafter.

11.1 Slab Amplifier in which Optical Paths Intersect

Figure 10A:
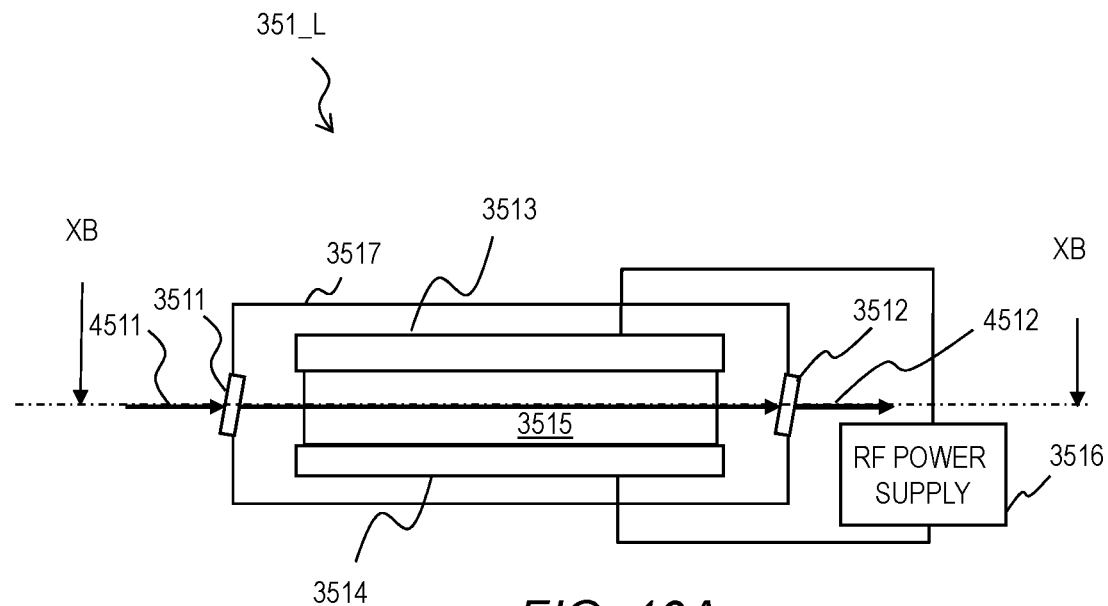
FIG. 10A schematically illustrates a configuration example of a slab amplifier in which optical paths intersect.
Figure 10B:
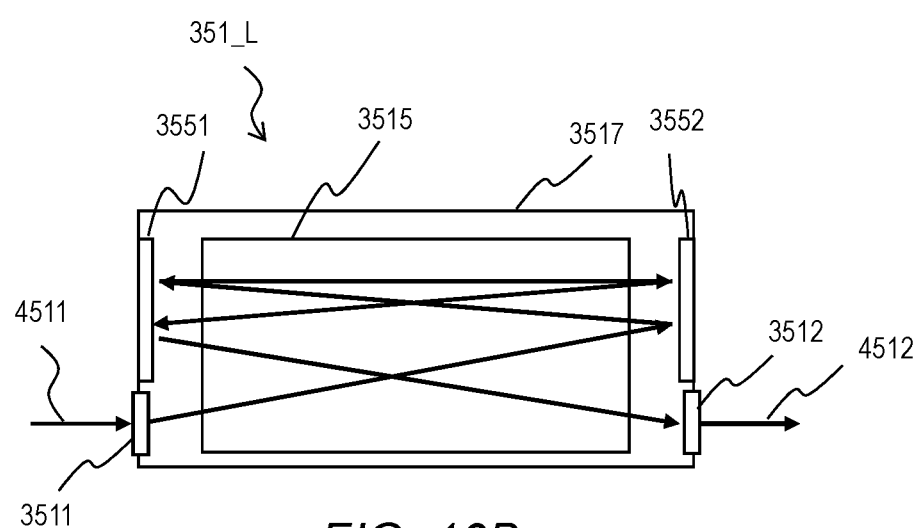
FIG. 10B is a cross-sectional diagram taken along the line XB-XB in FIG. 10A.

FIGS. 10A and 10B schematically illustrate a configuration example of a slab amplifier 351_L in which optical paths intersect. FIG. 10B is a cross-sectional diagram taken along the line XB-XB in FIG. 10A. The slab amplifier 351_L may include a chamber 3517 for containing components. The slab amplifier 351_L may further include laser gas including $CO_2$, electrodes 3513 and 3514 for exciting the laser gas by discharging electricity, and an RF power supply 3516 for supplying an RF voltage to the electrodes 3513 and 3514.

The slab amplifier 351_L may include an input window 3511 for guiding a seed laser beam 4511 into the chamber 3517, an output window 3512 for outputting an amplified laser beam 4512, an input-side mirror 3551 and an output-side mirror 3552 for reflecting the laser beam inside the chamber 3517.

The laser beam may be amplified in the excited laser gas by being reflected repeatedly between the input-side mirror 3551 and the output-side mirror 3552. The optical paths of the repeatedly reflected laser beam may intersect.

11.2 Slab Amplifier in which Optical Paths do not Intersect

Figure 11A:
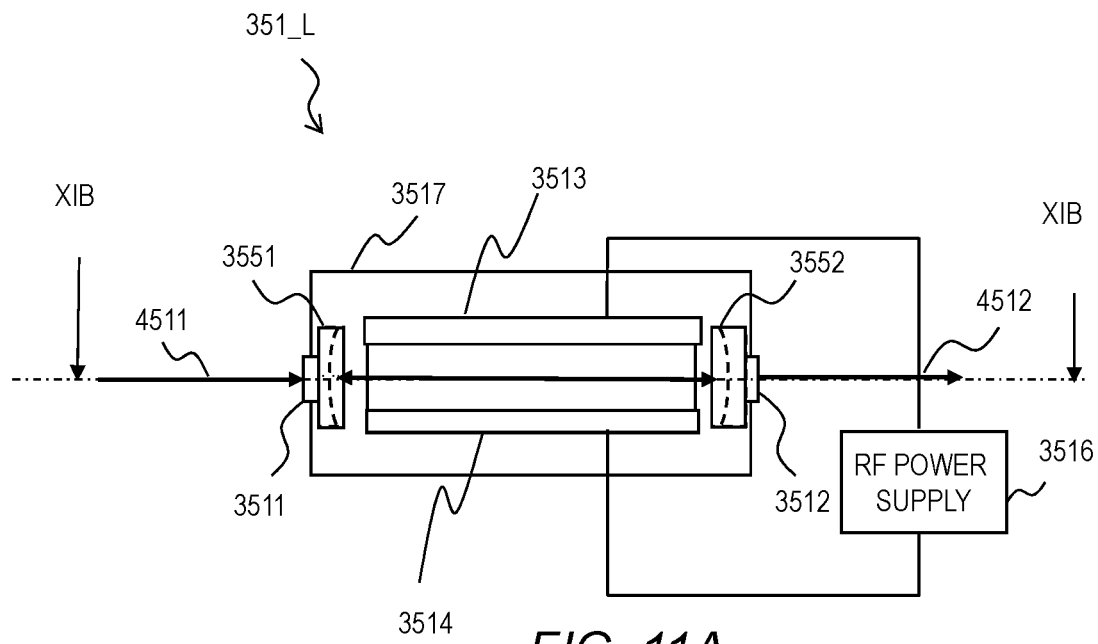
FIG. 11A schematically illustrates a configuration example of a slab amplifier in which optical paths do not intersect.
Figure 11B:
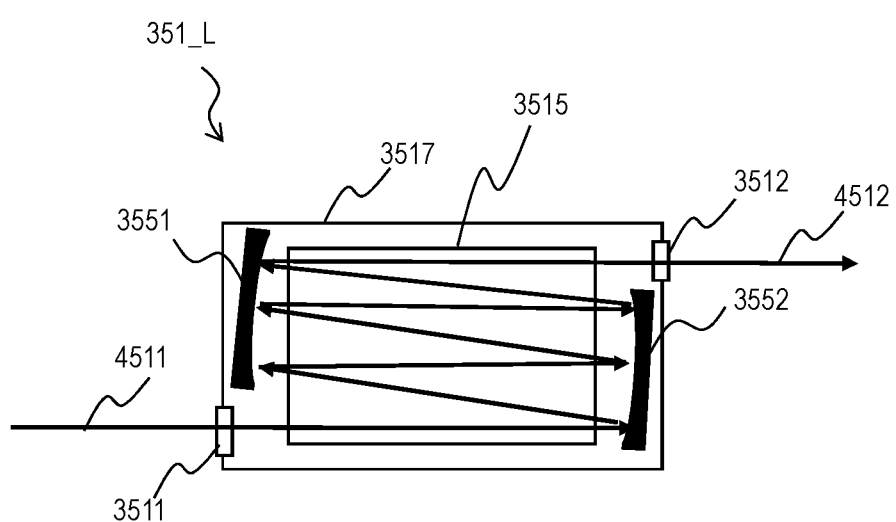
FIG. 11B is a cross-sectional diagram taken along the line XIB-XIB in FIG. 11A.

FIGS. 11A and 11B schematically illustrate another configuration example of a slab amplifier 351_L. FIG. 11B is a cross-sectional diagram taken along the line XIB-XIB in FIG. 11A. In the slab amplifier 351_L of this example, mirrors 3551 and 3552 may be concave mirrors. The laser beam may be amplified in the excited laser gas by being reflected repeatedly between the input-side concave mirror 3551 and the output-side concave mirror 3552. The optical paths of the repeatedly reflected laser beam may not intersect.

11.3 Coaxial-Type Slab Amplifier

Figure 12A:
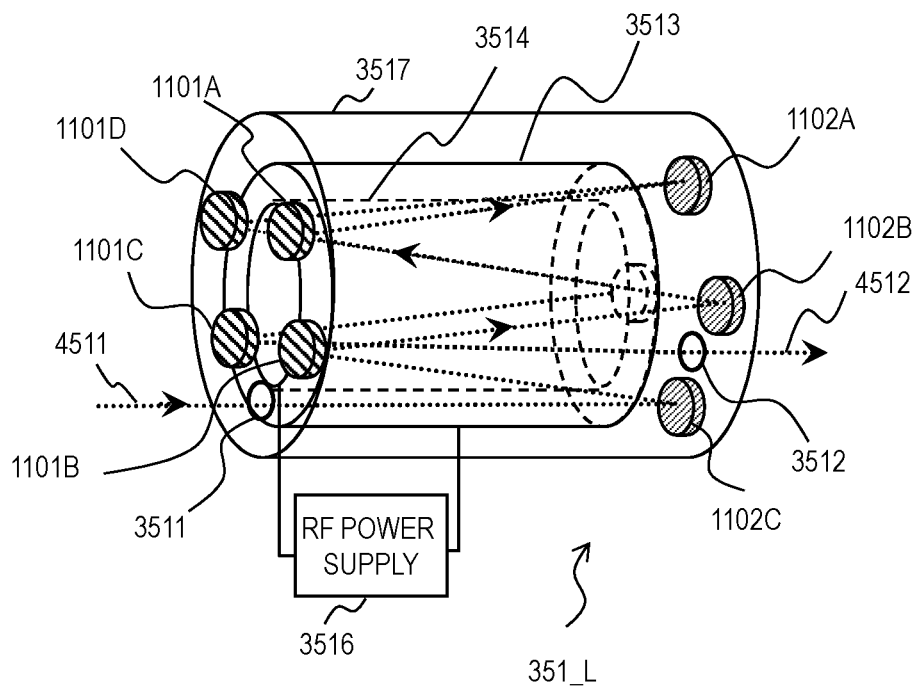
FIG. 12A schematically illustrates a configuration example of a coaxial-type slab amplifier.
Figure 12B:
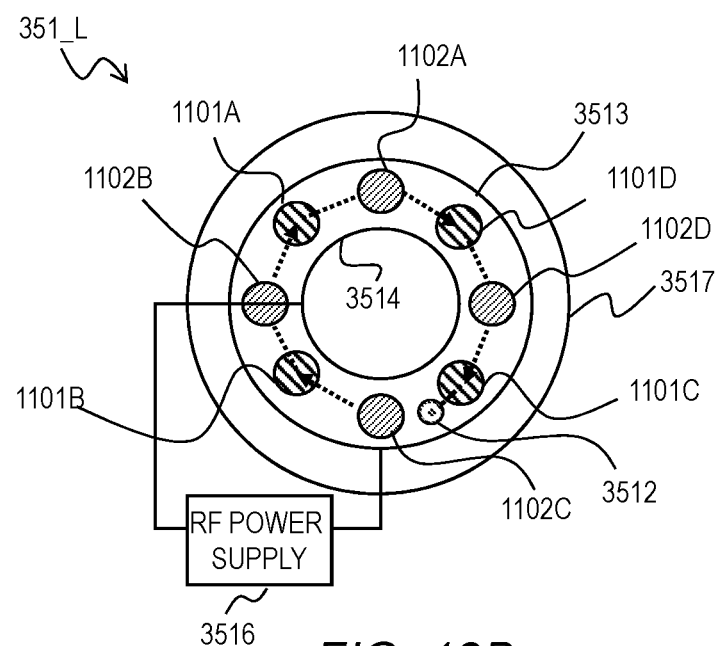
FIG. 12B schematically illustrates a configuration example of the coaxial-type slab amplifier.

FIGS. 12A and 12B schematically illustrate an example of a coaxial-type slab amplifier 351_L. FIG. 12A is a perspective diagram of the coaxial-type slab amplifier 351_L, in which a part of the components is seen through. FIG. 12B is a diagram of the coaxial-type slab amplifier 351_L as seen from the output side.

The coaxial-type slab amplifier 351_L includes a pair of coaxially-disposed cylindrical electrodes 3513 and 3514 in the chamber 3517. The coaxial-type slab amplifier 351_L may discharge electricity in the space between the cylindrical electrodes 3513 and 3514 with an RF power supply 3516 to excite the laser gas, changing the laser gas into amplification medium.

The coaxial-type slab amplifier 351_L may include input-side mirrors 1101A to 1101D and output-side mirrors 1102A to 1102D. The input-side mirrors 1101A to 1101D may be disposed in a circular pattern. The output-side mirrors 1102A to 1102D may be disposed in a circular pattern.

The seed laser beam 4511 that has entered through the input window 3511 may repeat traveling back and forth between the input-side mirrors 1101A to 1101D and the output-side mirror 1102A to 1102D in the excited laser gas. The amplified laser beam 4512 may go out from the output window 3512.

Specifically, in the amplifier 351_L, the laser beam may be reflected by the output-side mirror 1102C, the input-side mirror 1101B, the output-side mirror 1102B, the input-side mirror 1101A, the output-side mirror 1102A, the input-side mirror 1101D, the output-side mirror 1102D, and the input-side mirror 1101C in this order.

11.4 Fast Axial Flow Amplifier

Figure 13A:
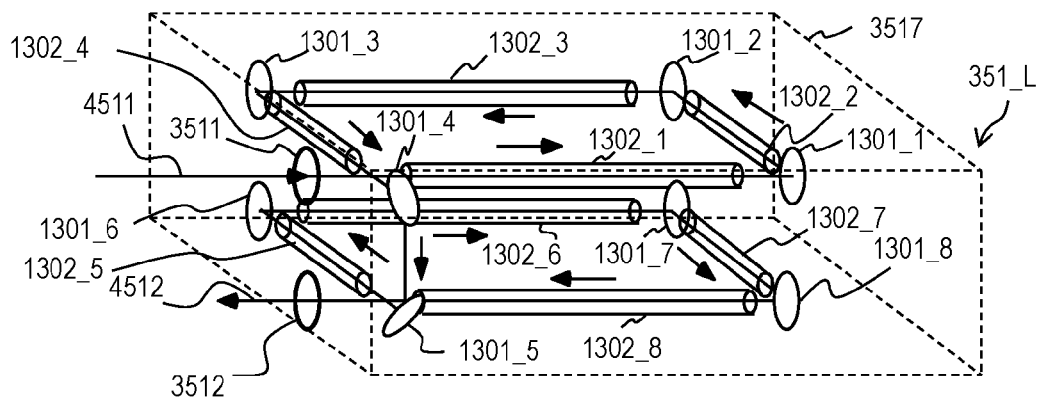
FIG. 13A is a perspective diagram of a fast axial flow amplifier.
Figure 13B:
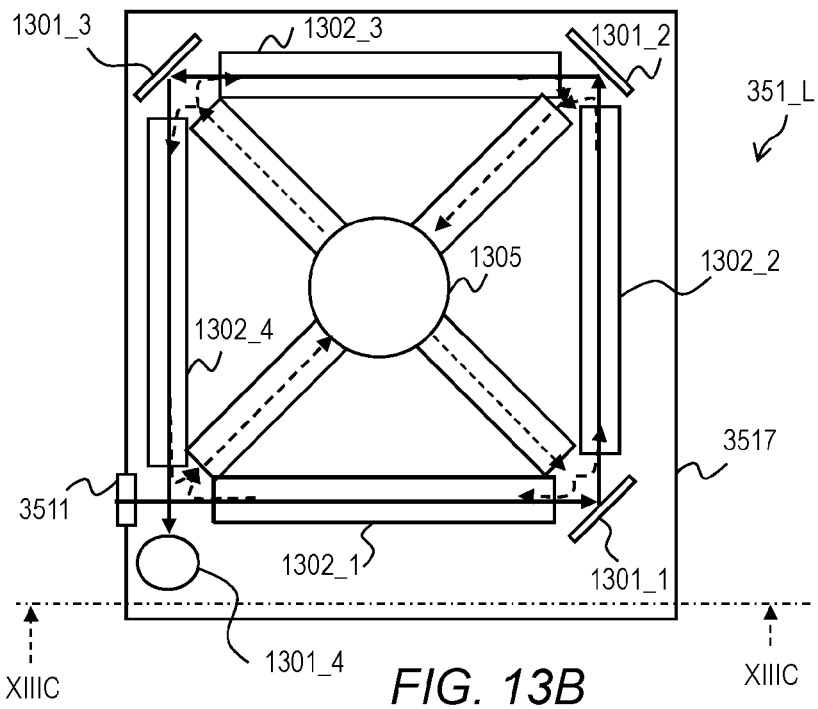
FIG. 13B is a top plan diagram of the fast axial flow amplifier.
Figure 13C:
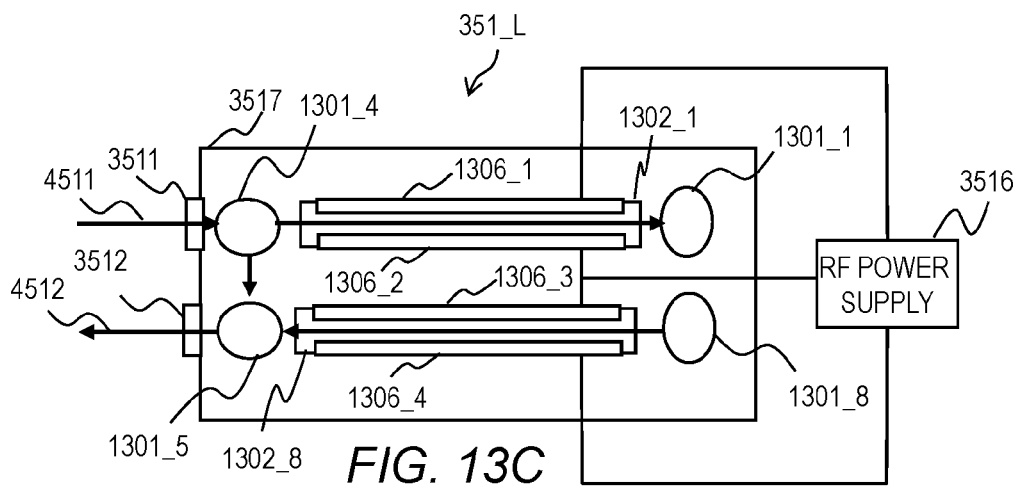
FIG. 13C is a cross-sectional diagram taken along the line XIIIC-XIIIC in FIG. 13B.

FIGS. 13A to 13C schematically illustrate a configuration example of a fast axial flow amplifier 351_L. FIG. 13A is a perspective diagram of the fast axial flow amplifier 351_L, in which a part of the components is seen through. FIG. 13B is a top plan diagram of the fast axial flow amplifier 351_L, in which a part of the components is seen through. FIG. 13C is a cross-sectional diagram taken along the line XIIIC-XIIIC in FIG. 13B.

As shown in FIG. 13A, the fast axial flow amplifier 351_L may include mirrors 1301_1 to 1301_8, upper discharge tubes 1302_1 to 1302_4, and lower discharge tubes 1302_5 to 1302_8. The laser beam may be amplified in the discharge tubes 1302_1 to 1302_8.

As shown in FIG. 13B, the fast axial flow amplifier 351_L may include a blower 1305. The blower 1305 may circulate laser gas in the discharge tubes 1302_1 to 1302_8. In FIG. 13B, the dashed arrows represent circulating laser gas.

Each of the discharge tubes 1302_1 to 1302_8 may include a pair of electrodes. As shown in FIG. 13C, the discharge tube 1302_1 may include electrodes 1306_1 and 1306_2. The discharge tube 1302_8 may include electrodes 1306_3 and 1306_4.

An RF power supply 3516 may supply an RF voltage to each of the discharge tubes 1302_1 to 1302_8 to cause the laser gas in the discharge tubes 1302_1 to 1302_8 to discharge electricity. The laser gas may be excited in the discharge tubes 1302_1 to 1302_8 to serve as amplification medium.

The laser beam that has entered through the input window 3511 may pass through the discharge tube 1302_1, be reflected off the mirror 1301_1, and pass through the discharge tube 1302_2. The laser beam may be reflected off the mirror 1301_2 and pass through the discharge tube 1302_3. The laser beam may be reflected off the mirror 1301_3 and pass through the discharge tube 1302_4.

The laser beam may be reflected off the mirrors 1301_4 and 1301_5 and pass through the discharge tube 1302_5. The laser beam may be reflected off the mirror 1301_6 and pass through the discharge tube 1302_6. The laser beam may be reflected off the mirror 1301_7 and pass through the discharge tube 1302_7. The laser beam may be reflected off the mirror 1301_8, pass through the discharge tube 1302_8, and goes out through the output window 3512.

11.5 Triaxial Cross Flow Amplifier

Figure 14A:
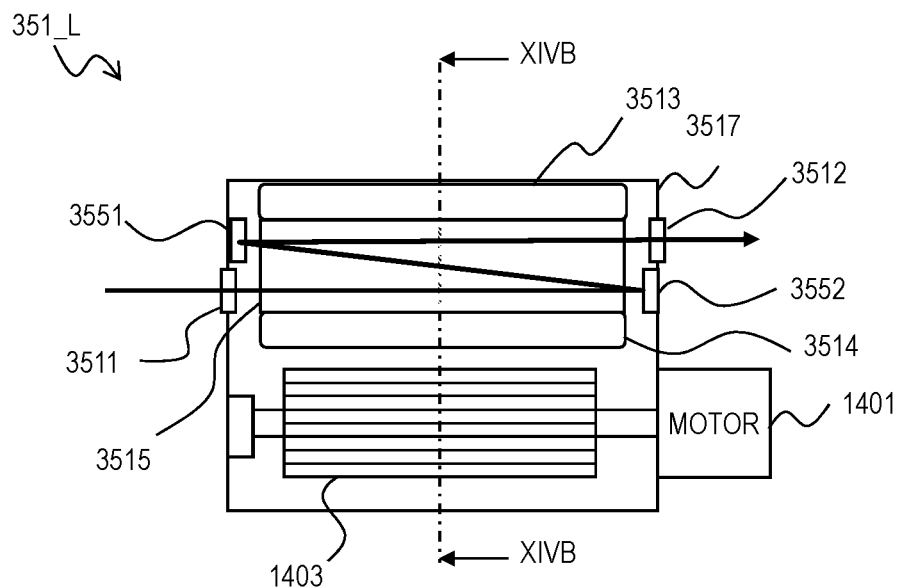
FIG. 14A schematically illustrates a configuration example of a triaxial cross flow amplifier.
Figure 14B:
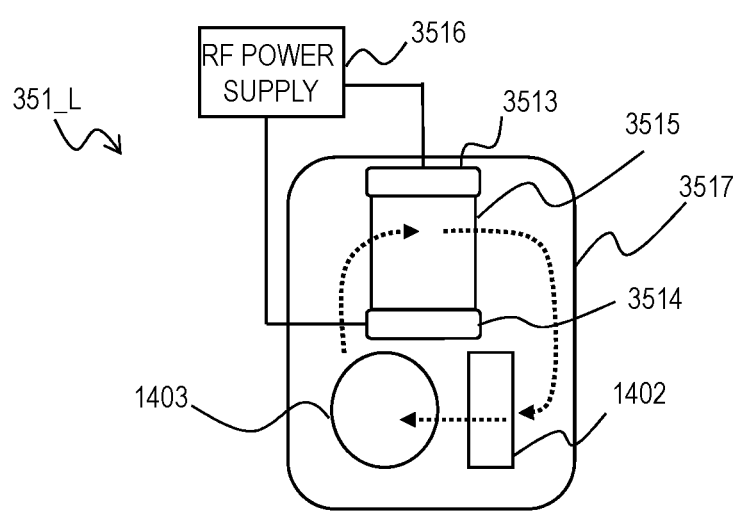
FIG. 14B is a cross-sectional diagram taken along the line XIVB-XIVB in FIG. 14A.

FIGS. 14A and 14B schematically illustrate a configuration example of a triaxial cross flow amplifier 351_L. FIG. 14A is a side diagram of the triaxial cross flow amplifier 351_L, in which a part of the components is seen through. FIG. 14B is a cross-sectional diagram taken along the line XIVB-XIVB in FIG. 14A.

The triaxial cross flow amplifier 351_L may include a pair of electrodes 3513 and 3514, a pair of mirrors 3551 and 3552, an RF power supply 3516, a cross-flow fan 1403, a motor 1401, and a cooling unit 1402.

The motor 1401 may rotate the cross-flow fan 1403 to circulate the laser gas between the electrodes 3513 and 3514. The cooling unit 1402 may cool down the laser gas. The RF power amplifier 3516 may supply an RF voltage across the electrodes 3513 and 3514 to cause the laser gas to discharge electricity in a discharge region 3515. The laser gas in the discharge region 3515 may be excited to become amplification medium.

A laser beam that has entered through an input window 3511 may be reflected off the mirrors 3551 and 3552 and pass through the discharge region 3515. The laser beam may be amplified in the discharge region 3515. The amplified laser beam may go out from the output window 3512.

12. Optical Switch

Figure 15:
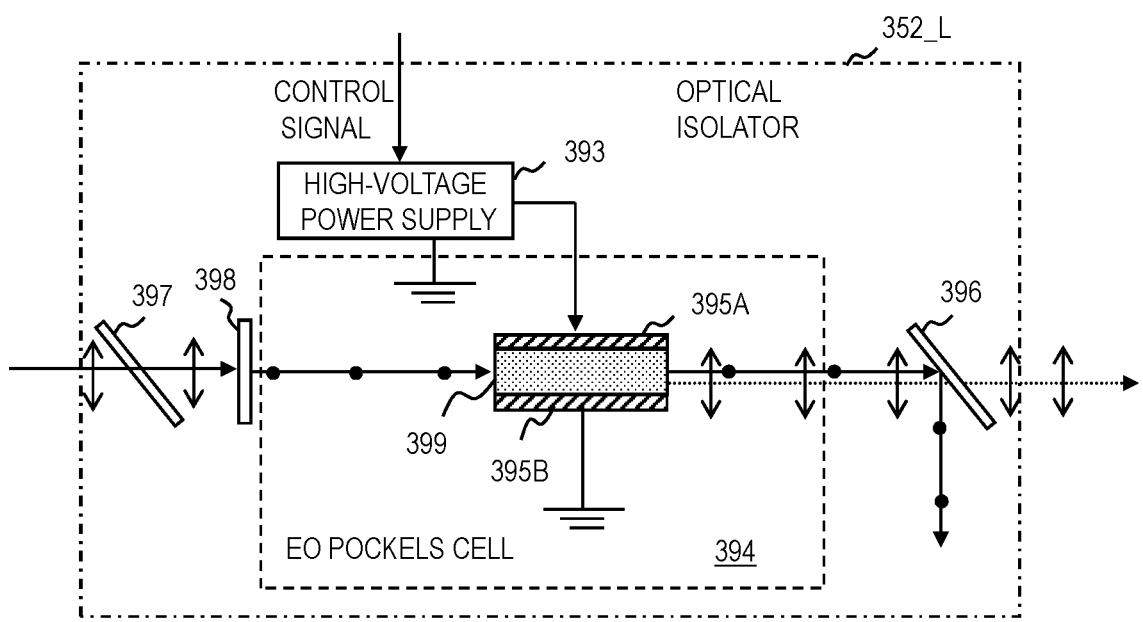
FIG. 15 schematically illustrates a configuration example of an optical isolator.

FIG. 15 schematically illustrates a configuration example of an optical isolator 352_L (L is any number of 0 to N). The optical isolator is one of the optical switches. The optical isolator 352_L may include a high-voltage power supply 393, an EO Pockels cell 394, a first polarizer 396, a second polarizer 397, and a λ/2 plate 398. The EO Pockels cell 394 may include a pair of electrodes 395A and 395B opposed to each other across an electro-optic crystal 399.

The second polarizer 397 and the λ/2 plate 398 may be disposed on the optical path on the input side of the EO Pockels cell 394. The first polarizer 396 may be disposed on the optical path on the output side of the EO Pockels cell 394.

The high-voltage power supply 393 may output a control voltage for the EO Pockels cell 394. The high-voltage power supply 393 may receive a pulse signal from a one-shot circuit included in the laser apparatus 3.

When a pulse signal serving as a control signal is ON, the high-voltage power supply 393 may generate a predetermined voltage other than 0 V and apply the voltage between the pair of electrodes 395A and 395B of the EO Pockels cell 394. When the pulse signal is OFF, the high-voltage power supply 393 may apply a voltage of approximately 0 V between the pair of electrodes 395A and 395B of the EO Pockels cell 394.

The pulse laser beam outputted from the optical amplifier 351_L of the laser apparatus 3 may be a light beam linearly polarized in a direction parallel to the plane of the sheet. The second polarizer 397 may transmit the pulse laser beam, which is light linearly polarized in a direction parallel to the plane of the sheet, at high transmittance and reflect light linearly polarized in a direction perpendicular to the plane of the sheet into a direction different from the incident optical path. The λ/2 plate 398 may rotate the polarization direction of the pulse laser beam by 90 degrees to transmit the pulse laser beam. That is to say, the pulse laser beam outputted from the λ/2 plate 398 may be a beam linearly polarized in a direction perpendicular to the plane of the sheet.

When a predetermined high voltage is applied between the pair of electrodes 395A and 395B, the EO Pockels cell 394 may change the phase difference between orthogonal polarization components of the pulse laser beam by 180 degrees to transmit the pulse laser beam. That is to say, the EO Pockels cell 394 may rotate the polarization direction of the pulse laser beam by 90 degrees to transmit the pulse laser beam. When no voltage is applied between the pair of electrodes 395A and 395B, the EO Pockels cell 394 may transmit the pulse laser beam without changing the phase difference between orthogonal polarization components of the pulse laser beam. That is to say, the EO Pockels cell 394 may transmit the pulse laser beam without changing the polarizing direction.

The first polarizer 396 may transmit light of a pulse laser beam linearly polarized in a direction parallel to the plane of the sheet and reflect light linearly polarized in a direction perpendicular to the plane of the sheet into a direction different from the optical path of the pulse laser beam.

That is to say, the first polarizer 396 may transmit a pulse laser beam modulated by the EO Pockels cell 394 when the control signal is ON. The first polarizer 396 may reflect a pulse laser beam unmodulated by the EO Pockels cell 394 into a direction different from the incident optical path when the control signal is OFF.

As described above, the optical isolator 352_L may exhibit functionality of an optical isolator by well transmitting light from the upstream and the downstream when a high voltage is applied to the EO Pockels cell 394 and restraining the transmission of light from both of the upstream and the downstream when the high voltage is not applied to the EO Pockels cell 394 and the applied voltage to the EO Pockels cell 394 is approximately 0 V.

The high-voltage power supply 393 may apply pulses of high voltage to the pair of electrodes 395A and 395B by rapidly turning on and off a charging switch connected with the high voltage and a discharge switch connected with the GND.

An optical shutter may be used as an optical switch. The optical shutter may have a configuration such that the second polarizer 397 and the λ/2 plate 398 are omitted from the configuration of the optical isolator 352_L shown in FIG. 15.

13. Other Embodiments 13.1 Issues

In the present embodiments, issues raised by an ASE beam of an optical amplifier 351_L reflected off a droplet 27 and means to address the issues are discussed. An ASE beam emitted from the optical amplifier 351_L may hit a droplet 27 even when the master oscillator 350 does not output a pulse laser beam. The droplet 27 may reflect the incident light. A transmissive optical element in the laser apparatus 3 may reflect the reflection from the droplet 27. As a result, optical resonance may occur between consecutively ejected droplets 27 and the optical element of the laser apparatus 3.

Figure 16:
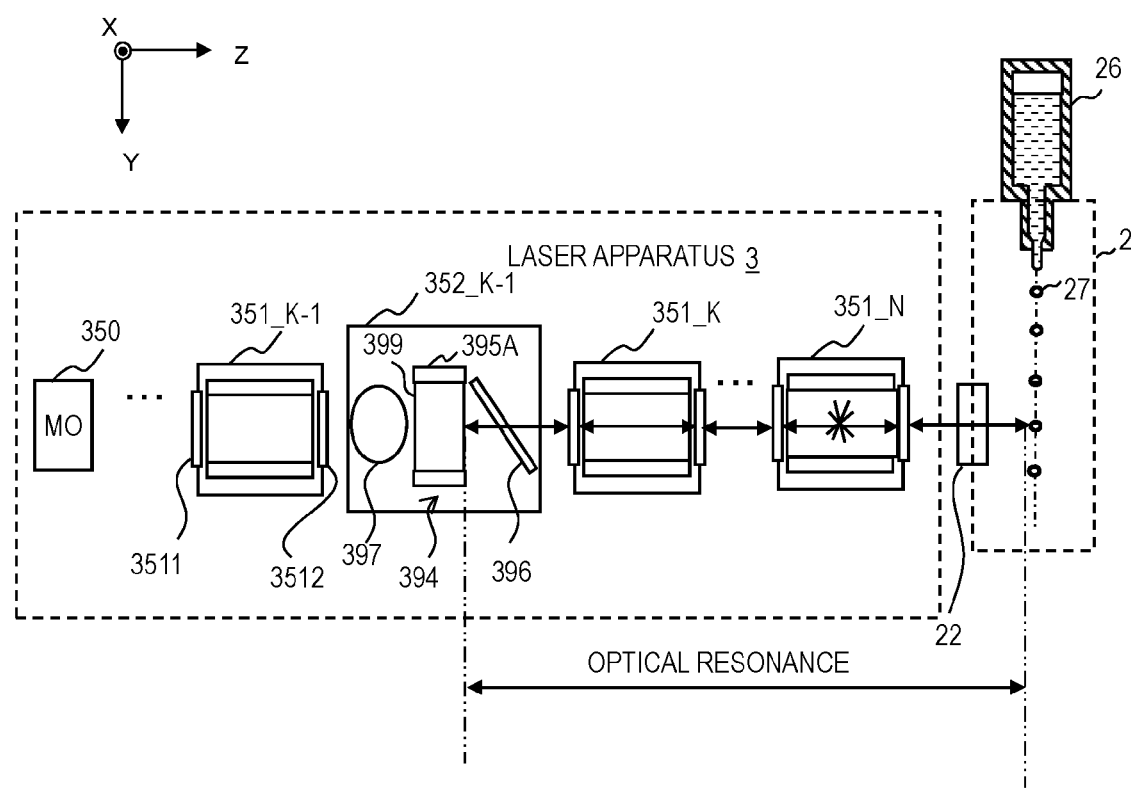
FIG. 16 schematically illustrates an example of generation of a self-oscillation beam caused by an ASE beam reflected off droplets.

FIG. 16 schematically illustrates an example of generation of a self-oscillation beam caused by an ASE beam reflected off droplets 27. In FIG. 16, the axis extending in the direction of the width of the sheet is defined as Z-axis; the axis extending in the direction of the length of the sheet is defined as Y-axis; and the axis extending in the direction perpendicular to the plane of the sheet is defined as X-axis. The trajectory of the droplets 27 is parallel to the Y-axis. In the configuration example of FIG. 16, no other optical isolator is disposed on the output side of the optical isolator 352_K-1. The optical isolators 352_0 to 352_K-2 on the input side are omitted in FIG. 16.

For example, as shown in FIG. 16, an ASE beam from the optical amplifier 351_N may hit a droplet 27. The reflection off the droplet 27 may be amplified by the optical amplifiers 351_N to 351_K and apply to the surface of the electro-optic crystal 399 of the EO Pockel cell 394 of the optical isolator 352_K. The electro-optic crystal 399 may reflect the applied amplified beam.

The beam reflected by the electro-optic crystal 399 may be amplified again by the optical amplifiers 351_K to 351_N and hit a droplet 27. Reflecting the amplified beam may be repeated between consecutively ejected droplets 27 and the reflective face of the electro-optic crystal 399 to cause optical resonance. The optical resonance may occur between droplets 27 and a different EO pockels cell, or between droplets 27 and a transmissive optical element other than the electro-optic crystal 399.

As a result, even when the master oscillator 350 does not output a pulse laser beam, a laser beam generated by the optical resonance may hit droplets 27, so that the optical amplifiers involved in the optical resonance may reduce their gains.

13.2 Configurations and Operations

Figure 17A:
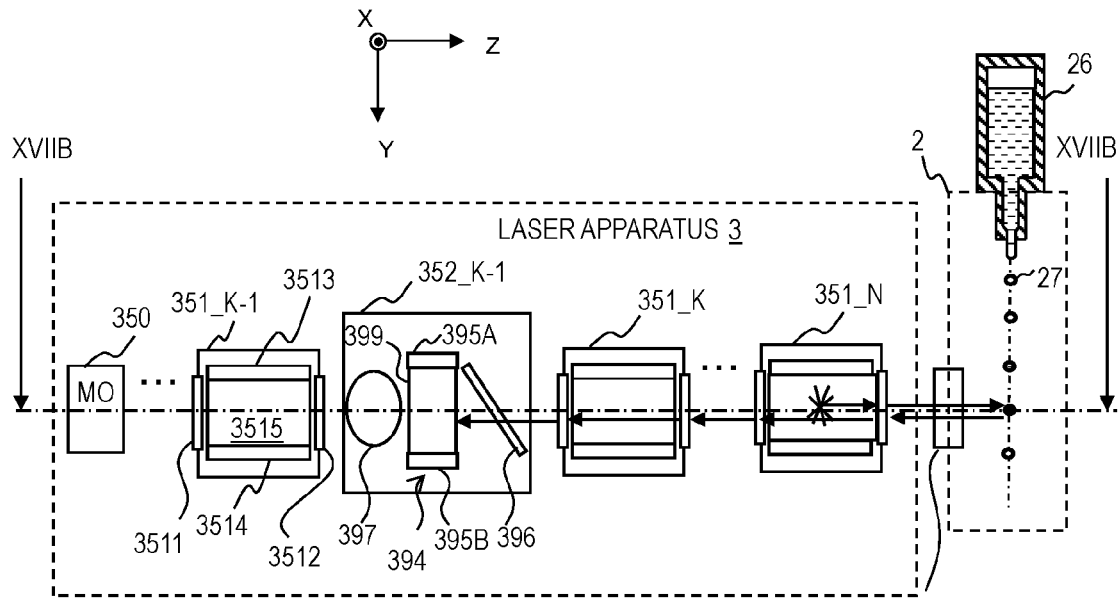
FIG. 17A schematically illustrates a laser apparatus and a target supply device in another embodiment.
Figure 17B:
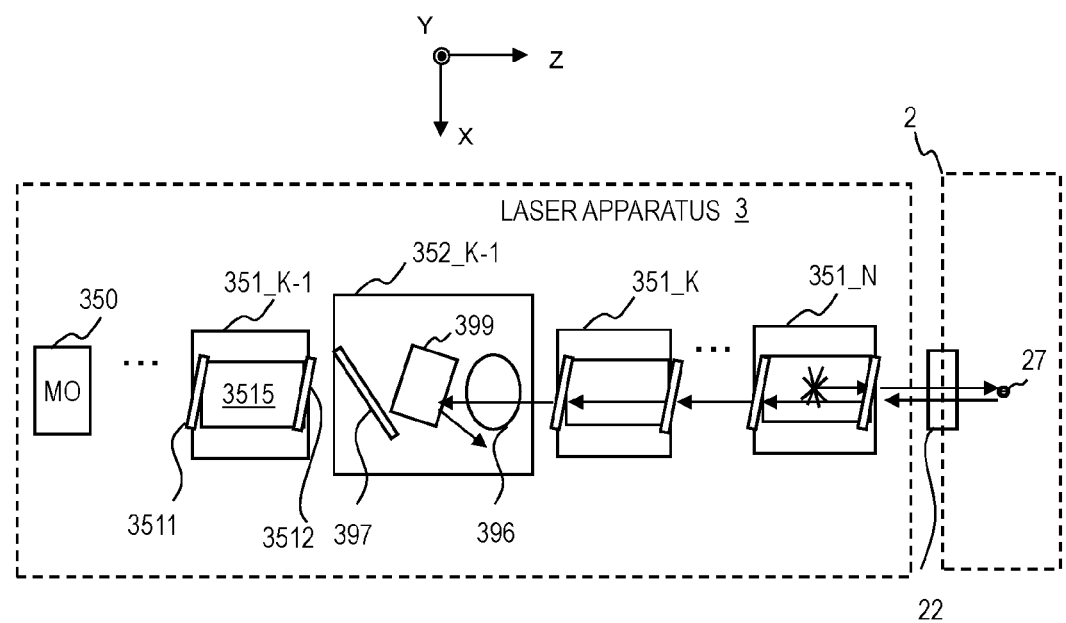
FIG. 17B is a cross-sectional diagram taken along the line XVIIB-XVIIB in FIG. 17A.

FIGS. 17A and 17B schematically illustrate a configuration example of a laser apparatus 3 in the present embodiment. FIG. 17A illustrates the laser apparatus 3 and a target supply device 26 as seen in the X-axis direction, like FIG. 16. FIG. 17B is a cross-sectional diagram taken along the line XVIIB-XVIIB in FIG. 17A and illustrates the laser apparatus 3 and droplets 27 as seen in the Y-axis direction, which is parallel to the trajectory of the droplets 27.

FIGS. 17A and 17B illustrate an example of an ASE beam emitted from the optical amplifier 351_N. The ASE beam from the optical amplifier 351_N may be reflected off a droplet 27 and hit the output-side face of the electro-optic crystal 399 of the EO Pockels cell 394. As illustrated in FIG. 17B, the EO Pockels cell 394 may be positioned at an angle such that the reflection from a droplet 27 hits the output-side face of the electro-optic crystal 399 but the reflection off the output-side face does not hit a droplet 27. Preferably, the angle of the output-side face of the electro-optic crystal 399 may be adjusted so that the spot where the reflection off the electro-optic crystal 399 amplified by the optical amplifiers 351_N to 351_K is focused by the laser beam focusing mirror 22 will be off the trajectory of droplets 27.

The beam reflected off the electro-optic crystal 399 may not hit a droplet 27. Accordingly, optical resonance may not occur between the electro-optic crystal 399 and droplets 27.

As illustrated in FIG. 17B, the transmissive optical elements other than the EO Pockels cell 394 may be fixed at a tilted position such that optical resonance will not occur with the droplets 27. For example, the input windows 3511 and output windows 3512 of the optical amplifiers may be tilted with respect to the reflection from the droplets 27 so that the reflection from the optical amplifiers will be off the trajectory of the droplets 27.

All the transmissive optical elements in the laser apparatus 3 that may cause optical resonance with the droplets 27 may be positioned as described above. A part or all of the transmissive optical elements in the laser apparatus 3 that may transmit a pulse laser beam may be positioned as described above.

Figure 18A:
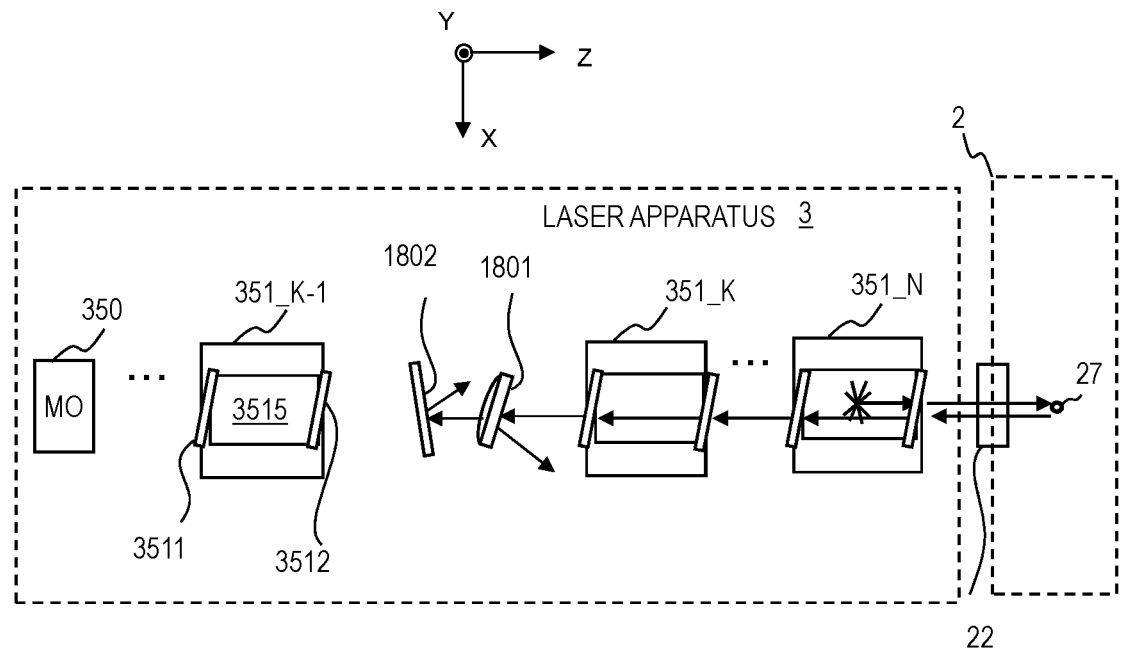
FIG. 18A illustrates another embodiment including a plano-convex lens and a wavelength plate as examples of transmissive optical elements in a laser apparatus.

FIG. 18A provides a plano-convex lens 1801 and a wavelength plate 1802 as examples of transmissive optical elements in the laser apparatus 3. The output-side faces of the plano-convex lens 1801 and the wavelength plate 1802 may be flat. The output-side faces of the plano-convex lens 1801 and the wavelength plate 1802 may be positioned to tilt so that the focusing spot where the refection off the plano-convex lens 1801 and the wavelength plate 1802 amplified by the optical amplifiers 351_N to 351_K is focused by the laser beam focusing mirror 22 will be off the trajectory of the droplets 27.

Figure 18B:
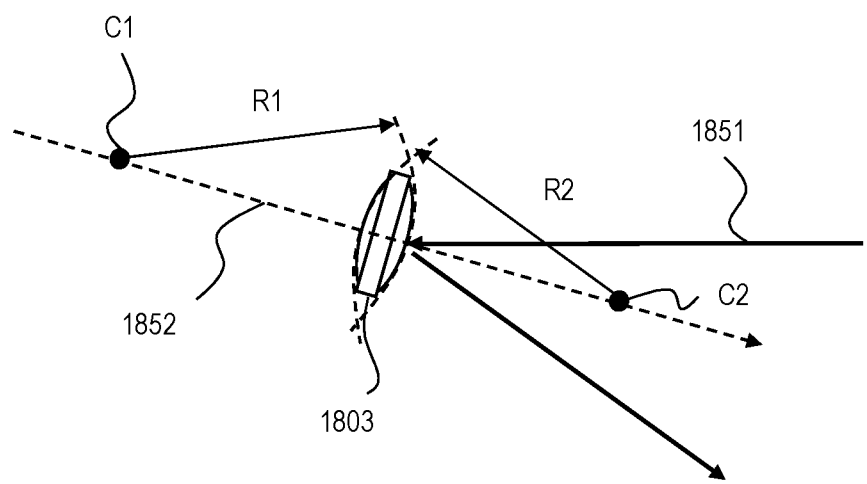
FIG. 18B illustrates an example of positioning of a spherical lens in another embodiment.

FIG. 18B provides a spherical lens 1803 as an example of a transmissive optical element in the laser apparatus 3. The tilt angle for the transmissive optical element having a spherical face on the output side may be adjusted as follows. The optical axis 1852 of the spherical lens 1803 may be defined as the line connecting the center C1 of the curvature radius R1 of the first face and the center C2 of the curvature radius R2 of the second face. The spherical lens 1803 may be positioned to tilt so that the optical axis 1852 of the spherical lens 1803 will not be the same as the optical axis of the reflection 1851 from a droplet 27.

13.3 Effects

The present embodiment may reduce the occurrence of optical resonance caused by an ASE beam from an optical amplifier 351_L repeatedly being reflected between a transmissive optical element in the laser apparatus 3 and droplets 27.

The foregoing description is merely provided for the purpose of exemplification but not limitation. Accordingly, it is obvious for a person skilled in the art that the embodiments in this disclosure may be modified within the scope of the appended claims.

A part of the configuration of an embodiment may be replaced with a configuration of another embodiment. A configuration of an embodiment may be incorporated to a configuration of another embodiment. A part of the configuration of each embodiment may be removed, added to a different configuration, or replaced by a different configuration.

The terms used in this specification and the appended claims should be interpreted as "non-limiting". For example, the terms "include" and "be included" should be interpreted as "including the stated elements but not limited to the stated elements". The term "have" should be interpreted as "having the stated elements but not limited to the stated elements". Further, the modifier "one (a/an)" should be interpreted as "at least one" or "one or more."

What is claimed is:

1. A laser apparatus comprising:
   a master oscillator capable of outputting a pulse laser beam;
   a plurality of optical amplifiers disposed on an optical path of the pulse laser beam outputted from the master oscillator, the plurality of optical amplifiers being configured to sequentially amplify the pulse laser beam;
   an optical reflector disposed off an optical path of the pulse laser beam, capable of passing the pulse laser beam therethrough and reflecting a self-oscillation beam generated in one of the plurality of optical amplifiers; and
   an optical absorber capable of receiving and absorbing the self-oscillation beam reflected by the optical reflector.

2. The laser apparatus according to claim 1, wherein the optical reflector is a hollow object having a through-hole through which the pulse laser beam passes, and
   at least one of an inner face and an outer face of the optical reflector is a reflective face capable of reflecting the self-oscillation beam.

3. The laser apparatus according to claim 2, wherein the optical absorber is a hollow object having a through-hole through which the pulse laser beam passes and is disposed coaxially with the optical reflector.

4. The laser apparatus according to claim 2, wherein the inner face and the outer face of the optical reflector are reflective faces capable of reflecting the self-oscillation beam.

5. The laser apparatus according to claim 4, wherein an opening angle of the inner face is smaller than an opening angle of the outer face.

6. The laser apparatus according to claim 1, wherein the optical reflector has a flat shape.

7. The laser apparatus according to claim 6, wherein the optical absorber has a flat shape and is disposed on the opposite side of the optical reflector with respect to the optical path of the pulse laser beam.

8. The laser apparatus according to claim 1, wherein a material of the optical reflector is one of Al, Au, and Cu.

9. The laser apparatus according to claim 1, wherein a material of the optical absorber is one of Al, Cu, Si, GaAs, ZnSe, and diamond.

10. The laser apparatus according to claim 1, wherein the optical absorber is configured to contain the optical reflector therein.

11. The laser apparatus according to claim 1, further comprising an optical isolator disposed between the master oscillator and an optical amplifier of the plurality of optical amplifiers or between optical amplifiers of the plurality of optical amplifiers.

12. The laser apparatus according to claim 11, wherein the optical reflector is disposed between the optical isolator and one of the plurality of optical amplifiers.

13. An extreme ultraviolet light generation system comprising:
- a master oscillator capable of outputting a pulse laser beam;
- an optical amplifier disposed on an optical path of the pulse laser beam outputted from the master oscillator and capable of amplifying the pulse laser beam inputted into the optical amplifier and outputting spontaneous emission while the pulse laser beam is not inputted into the optical amplifier;
- a droplet supply device capable of supplying a droplet capable of turning into plasma by being irradiated with the pulse laser beam amplified by the optical amplifier to generate extreme ultraviolet light and reflecting the spontaneous emission from the optical amplifier; and
- a transmissive optical element disposed between the master oscillator and the optical amplifier and capable of transmitting the pulse laser beam, the transmissive optical element being positioned such that reflection of the spontaneous emission reflected off the droplet is directed to avoid the droplet.

14. A laser apparatus, comprising:
- a master oscillator capable of outputting a pulse laser beam;
- a plurality of optical amplifiers disposed on an optical path of the pulse laser beam outputted from the master oscillator, the plurality of optical amplifiers being configured to sequentially amplify the pulse laser beam;
- an optical reflector being a hollow object having a through-hole through which the pulse laser beam passes, at least one of an inner face and an outer face of the optical reflector being a reflective face capable of reflecting the self-oscillation beam; and
- an optical absorber containing the optical reflector therein and capable of receiving and absorbing the self-oscillation beam reflected by the optical reflector.

15. The laser apparatus according to claim 14, wherein an opening angle of the inner face is smaller than an opening angle of the outer face.

16. The laser apparatus according to claim 14, wherein a material of the optical reflector is one of Al, Au, and Cu.

17. The laser apparatus according to claim 14, wherein a material of the optical absorber is one of Al, Cu, Si, GaAs, ZnSe, and diamond.

18. The laser apparatus according to claim 14, further comprising an optical isolator disposed between the master oscillator and an optical amplifier of the plurality of optical amplifiers or between optical amplifiers of the plurality of optical amplifiers.

19. The laser apparatus according to claim 18, wherein the optical reflector is disposed between the optical isolator and one of the plurality of optical amplifiers.

* * * * *